US012074227B2

United States Patent
Lai et al.

(10) Patent No.: US 12,074,227 B2
(45) Date of Patent: Aug. 27, 2024

(54) SEMICONDUCTOR DEVICE INCLUDING DEEP TRENCH CAPACITORS AND VIA CONTACTS

(71) Applicant: Taiwan Semiconductor Manufacturing Company, Ltd., Hsinchu (TW)

(72) Inventors: Po-Chia Lai, Fremont, CA (US); Stefan Rusu, Sunnyvale, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 103 days.

(21) Appl. No.: 17/827,251

(22) Filed: May 27, 2022

(65) Prior Publication Data

US 2023/0387330 A1    Nov. 30, 2023

(51) Int. Cl.
*H01L 23/498*   (2006.01)
*H01L 23/48*    (2006.01)
*H01L 23/522*   (2006.01)
*H01L 29/66*    (2006.01)
*H01L 29/94*    (2006.01)
*H01L 49/02*    (2006.01)
*H10B 12/00*    (2023.01)

(52) U.S. Cl.
CPC .......... *H01L 29/945* (2013.01); *H01L 23/481* (2013.01); *H01L 23/5226* (2013.01); *H01L 28/91* (2013.01); *H01L 29/66181* (2013.01); *H10B 12/37* (2023.02)

(58) Field of Classification Search
CPC . H01L 29/945; H01L 29/66181; H01L 28/92; H01L 23/481; H01L 23/5226; H10B 12/37
See application file for complete search history.

(56) References Cited

U.S. PATENT DOCUMENTS

| | | | |
|---|---|---|---|
| 9,608,130 B2 | 3/2017 | Tran et al. | |
| 10,276,651 B2 * | 4/2019 | Lin | H01L 21/31053 |
| 2021/0005612 A1 | 1/2021 | Marzaki et al. | |

FOREIGN PATENT DOCUMENTS

| | | |
|---|---|---|
| TW | 202013442 A | 4/2020 |
| TW | 202125701 A | 7/2021 |
| TW | 202211409 A | 3/2022 |

OTHER PUBLICATIONS

Office Action issued in connection with Taiwan Appl. No. 112100723 dated Jan. 25, 2024.

* cited by examiner

*Primary Examiner* — Walter H Swanson
*Assistant Examiner* — Jacob T Nelson
(74) *Attorney, Agent, or Firm* — FOLEY & LARDNER LLP

(57) ABSTRACT

A semiconductor device and a method of manufacturing the semiconductor device are disclosed. In one aspect, the semiconductor device includes a plurality of deep trench capacitors and a plurality of via contacts that at least partially surround the deep trench capacitors. Variations may be made to the number and locations of the plurality of via contacts such that design requirements for the packaging are satisfied.

16 Claims, 23 Drawing Sheets

2100

| Parameter | Layout Design | | | | |
|---|---|---|---|---|---|
| | Original | 300 | 800 | 1100 | 1400 |
| Cap Density @ DC | Baseline | −39% | −21% | −12% | −3% |
| Cap Density @ AC (200MHz) | | 45% | 88% | 109% | 131% |
| Area | | 67% | 28% | 15% | 3% |

FIG. 20

SEMICONDUCTOR DEVICE INCLUDING DEEP TRENCH CAPACITORS AND VIA CONTACTS

BACKGROUND

Electronic equipment using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, various package technologies (e.g., a chip on wafer on substrate (CoWoS)) are used to integrate several chips into a single semiconductor device by through silicon via (TSV). In the CoWoS package, a number of chips or dies are assembled on a single semiconductor device. Furthermore, numerous manufacturing operations are implemented within such a small semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 20 illustrates an example table that shows gains in the capacitance density, in accordance with some embodiments.

DETAILED DESCRIPTION

Figure 1:
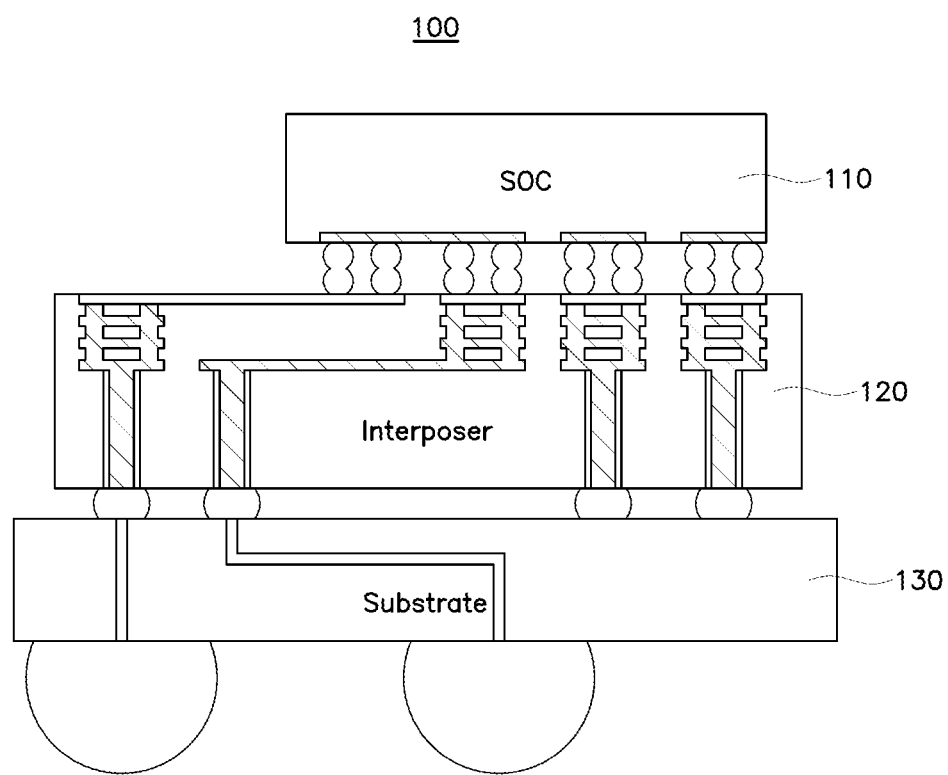
FIG. 1 illustrates a side view of a package that includes an interposer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As several chips are integrated together using the CoWoS process, interposers are formed below the chips and can include routing of signals and power supply lines for the chips that are connected to one another. The TSVs are formed within the interposers to enable the formation of connection lines between chips as well as power supply lines (VDD, VCC, VSS, etc.). The TSVs are then exposed on the opposite side of the interposer and bonded to the package substrate. Within the interposer, deep trench capacitors (DTCs) may be formed which can help remove noise and provide stable voltages.

In order to increase yield of the semiconductor devices, DTCs are often designed with horizontal and vertical orientations. Typically, the plates that form the capacitors are connected to via contacts at opposing ends of the set of deep trench capacitors. For example, vertically oriented DTCs are aligned together in the horizontal direction and extend in the vertical direction. Via contacts are disposed on lateral ends of the DTCs, e.g., above the top portion of the DTC and below the bottom portion of the DTC (in a top down view). For a signal to traverse through the DTC, the signal traverses through the top via contact, one trench, and the bottom via contact. Because the vertically oriented DTCs have only one trench through which the signals have to traverse, the vertical DTCs have a low ESR and a high AC capacitance density. On the other hand, horizontally oriented DTCs have multiple trenches that are aligned adjacent to one another in the vertical direction and extend in the horizontal direction. Via contacts are typically formed above the first trench and below the last trench (in a top down view). This may cause a high ESR because the electrical signals (e.g., VSS, VDD, I/O signals) have to traverse all of the horizontal trenches, which are still only one capacitor. The high ESR can lead to low AC capacitance density, which reduces the stability of the signals. Accordingly, there is a need for DTCs in the interposers that can maximize capacitance and reduce the ESR, without compromising the size of the effective area and the stability provided by the DTCs.

In the present disclosure, a novel design of DTCs and surrounding structures can provide several advantages over the current technology. The DTCs can be formed in the interposer with multiple via contacts formed in order to reduce the ESR and increase the capacitance. For example, DTCs can be formed with multiple via contacts that are connected to the bottom and top plates of the DTCs. As another example, the DTCs may be formed with via contacts laterally surrounding the DTCs. As a further example, the DTCs may be formed with via contacts that are shared between adjacent DTCs. A plurality of variations of the DTCs and via contacts may be designed to advantageously decrease the ESR and increase the AC capacitance density, thereby increasing the operating frequency of the chips.

FIG. 1 illustrates a side view of a package 100 that includes an interposer, in accordance with some embodiments. The package 100 may be formed using the CoWoS process and includes integrated circuit (IC) chips 110, interposer 120, and a package substrate 130.

The chips 110 may include any kind of semiconductor chip. For example, the chips 110 may include a microprocessor, a memory device (e.g., dynamic random access memory (DRAM)), field programmable gate array (FPGA), system-on-chip (SOC), etc. Although only one chip 110 is shown in FIG. 1, any number of chips 110 may be formed. The chips 110 may be connected together using interconnect layers formed in the interposer 120. The interposer 120 may be bonded to the chips 110. The interposer 120 may include one or more layers of a semiconductor material such as silicon, germanium, gallium, arsenic, Si—Ge, any other suitable semiconductor material or combination thereof. In some embodiments, the interposer 120 may include a silicon interposer. The substrate 130 may include a package substrate on which the interposer 120 is bonded. The package substrate may transmit electrical signals between the chips to the main board (e.g., printed circuit board (PCB)) on which other semiconductor chips and/or packages may be bonded.

In some embodiments, the DTCs and the via contacts of the present disclosure may be formed in the interposer 120, but embodiments are not limited thereto. For example, the DTCs and the via contacts may be formed in the chips 110.

Figure 2:
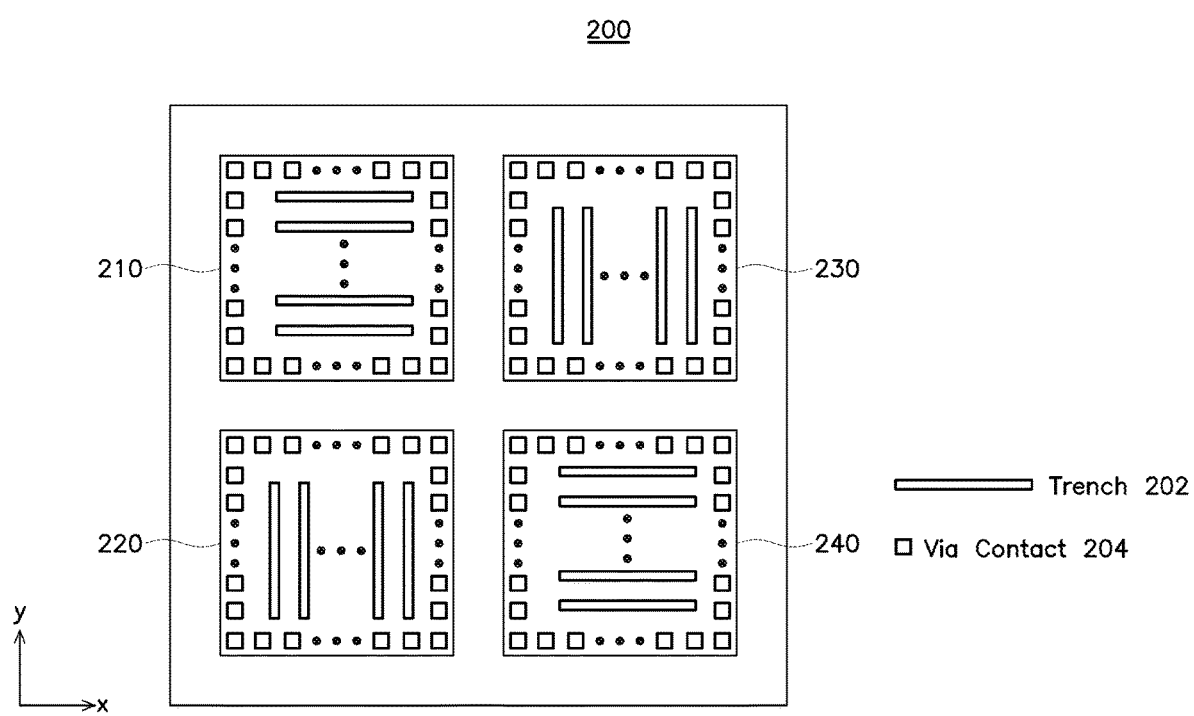
FIG. 2 illustrates an example design of a layout of the interposer, in accordance with some embodiments.

FIG. 2 illustrates a flattened top-down view of a portion of FIG. 1 where DTCs including contacts and the trenches are formed, in accordance with some embodiments. For example, the example design 200 may include a plurality of sub-capacitors 210, 220, 230, and 240. Each of the sub-capacitors 210-240 may include a plurality of trenches (e.g., DTCs) 202 and a plurality of via contacts 204. Although the example design 200 includes four sub-capacitors 210-240, embodiments are not limited thereto, and there may be more or fewer sub-capacitors, depending on embodiments.

The sub-capacitor 210 may include a plurality of first trenches 202 having a first orientation, where the first trenches 202 are aligned adjacent to one another in a y-direction each first trench 202 extends in an x-direction. The sub-capacitor 220 may include a plurality of second trenches 202 having a second orientation, where the second trenches 202 are aligned adjacent to one another in the x-direction and each second trench 202 extends in the y-direction. The sub-capacitor 230 may include a plurality of second trenches 202, and the sub-capacitor 240 may include a plurality of first trenches 202. Within each sub-capacitor 210-240, the trenches 202 may be spaced apart from one another with a first predetermined length, and the trenches 202 may each extend a second predetermined length. The via contacts 204 may surround the plurality of trenches 202 within the sub-capacitor 210. Although not shown in FIG. 2, the example design 200 may include additional via contacts surrounding the sub-capacitors 210-240.

The via contacts 204 may surround respective groups of trenches 202 within the sub-capacitors 210-240. For example, the via contacts 204 may surround the trenches 202 within the sub-capacitor 210, the via contacts 204 may surround the trenches 202 within the sub-capacitor 220, the via contacts 204 may surround the trenches 202 within the sub-capacitor 230, and the via contacts 204 may surround the trenches 202 within the sub-capacitor 240. Although each of the sub-capacitors 210-240 has a substantially square shape, embodiments are not limited thereto, and the sub-capacitors 210-240 may have a different shape and each of the sub-capacitors 210-240 may have a different shape from one another. For example, the sub-capacitor 210 may have a square shape, the sub-capacitor 220 may have a rectangular shape, etc. Furthermore, the via contacts 204 may be arranged in any suitable manner.

As discussed above, in conventional packages, if input and output nodes of chips 110 are connected at the top and bottom via contacts of trenches having a first orientation, the ESR may be high because the electrons have to traverse all of the trenches (e.g., traverse the first trench, then the second trench, then the third trench, etc.). However, if multiple via contacts are connected to the trenches using via contacts 204, the electrical signals do not have to traverse as many trenches 202 such that the ESR is lowered. Adding additional via contacts 204 that are connected to the trenches 202 may help reduce the ESR in the trenches 202 and increase AC capacitance density of the trenches 202. Furthermore, as will be discussed with respect to the figures, additional arrangements or designs of the via contacts 204 may help reduce the ESR.

Figure 3:
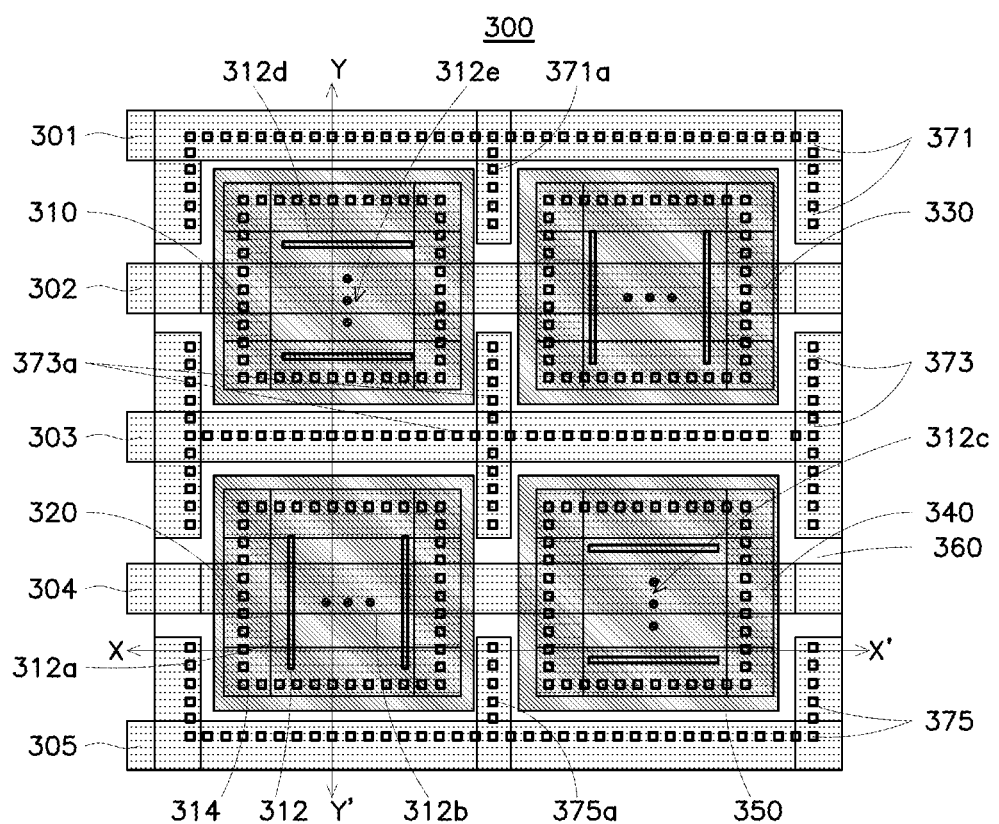
FIG. 3 illustrates a layout design of a package including the example design of FIG. 2, in accordance with some embodiments.

FIG. 3 illustrates a more detailed layout design 300 of a package including the example design 200 of FIG. 2, in accordance with some embodiments. For example, the sub-capacitors 310-340 may be similar to the sub-capacitors 210-240 of FIG. 2, respectively. In addition to the sub-capacitors 310-340, the layout design 300 may include a plurality of metal layers 301, 302, 303, 304, and 305, a plurality of sub-capacitors 310, 320, 330, and 340, a top plate 350, a bottom plate 360, and a plurality of outside via contacts 371, 373, and 375. Although the layout design 300 includes a certain number of features and a certain shape, embodiments are not limited thereto, and the layout design may have varying number of features and varying shapes.

The metal layers 301-305 may be disposed within the interposer (e.g., interposer 120) and carry electrical signals. For example, the metal layers 301, 303, and 305 may carry the voltage supply VSS, and the metal layers 302 and 304 may carry the voltage supply VDD. The metal layers 301-305 may be electrically connected to the chips (e.g., chips 110) that are disposed above the interposer. The metal layers 301-305 may be disposed on the same or different levels. For example, the metal layer 301 may be a different metal layer than the metal layer 302, etc.

The sub-capacitors 310-340 may be similar to the sub-capacitors 210-240 of FIG. 2, respectively. For example, each of the sub-capacitors 310-340 may include a plurality of trenches (e.g., DTCs) 312 that are formed adjacent to one another, either having the first orientation or the second orientation. Furthermore, each of the groups of trenches 312 may be surrounded by a plurality of via contacts 314 that are connected to the top or bottom plates 350 or 360 via metal structures (not shown).

The top plate 350 may be disposed within the interposer and function as a first plate of a capacitor (e.g., DTC). The bottom plate 360 may be disposed within the interposer and function as a second plate of the capacitor. Although not shown, a dielectric layer formed of high-k dielectric material may be disposed between the top plate 350 and the bottom plate 360. Accordingly, the top plate, 350, the dielectric layer, and the bottom plate 360 may form a capacitor.

The outside via contacts 371-375 may be connected to the top and bottom plates 350 and 360. For example, the outside via contacts 371, 373, and 375 may transmit a first voltage (e.g., first power supply voltage VSS) and be connected to the bottom plate 360. The via contacts 314 may transmit a second voltage (e.g., second power supply voltage VDD) and be connected to the top plate 350. In some embodiments, the outside via contacts 371, 373, and 375 may transmit the second voltage, and the via contacts 314 may transmit the first voltage. Although the examples in the figures are described with respect to transmitting power supply voltages VSS and VDD, embodiments are not limited thereto. For example, the outside via contacts 371-375 and via contacts 314 may be connected to differential input/output signal pairs and/or single-ended input/output signals.

The outside via contacts 371 may include a set of via contacts 371a that are formed between the sub-capacitors 310 and 330 and extend in the Y-Y' direction. The outside via contacts 373 may include a set of via contacts 373a that are formed between the sub-capacitors 310-340 such that the via contacts 373a extend in both the X-X' direction and the Y-Y' direction. The outside via contacts 375 may include a set of via contacts 375a that are formed between the sub-capacitors 320 and 340 and extend in the Y-Y' direction. These outside via contacts 371a, 373a, and 375a may be connected to the bottom plate 350. Further, the outside via contacts 371, 373, and 375 do not overlap the metal layers 302 and 304.

Figure 4:
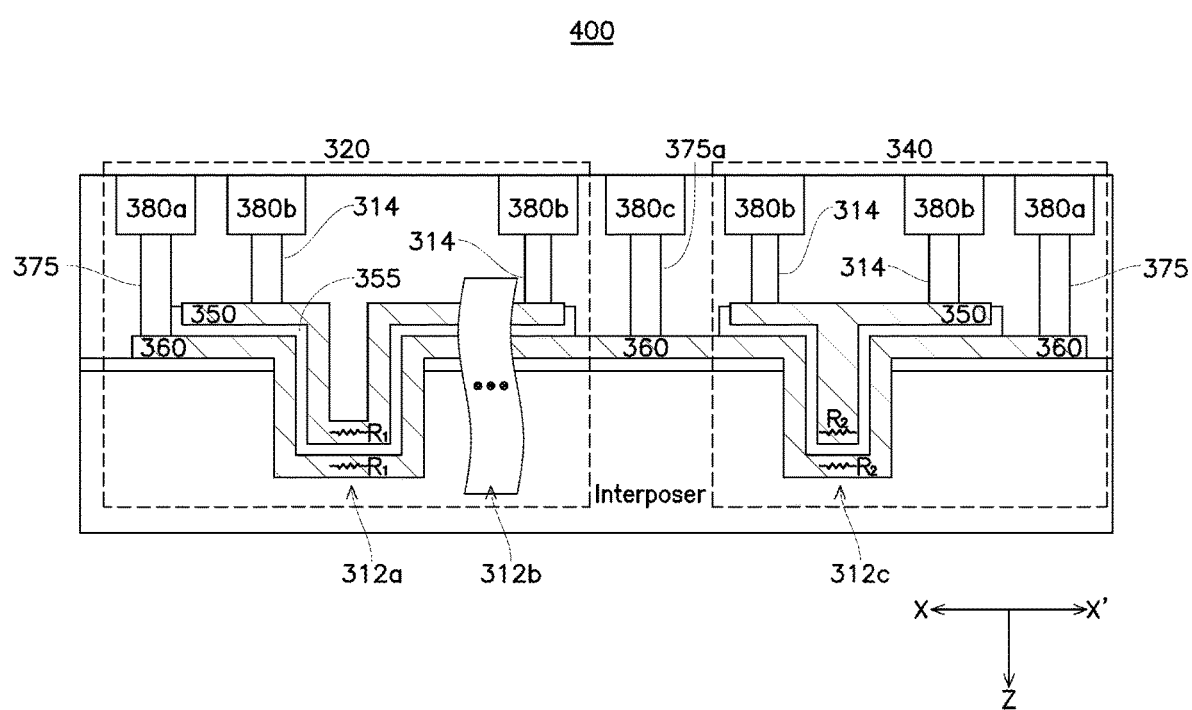
FIG. 4 illustrates a side view of the layout design along the line X-X' of FIG. 3, in accordance with some embodiments.

FIG. 4 illustrates a side view 400 of the layout design 300 along the line X-X' of FIG. 3, in accordance with some embodiments. The side view shows a portion of the layout design 300 including the interposer and the sub-capacitors 320 and 340. The sub-capacitor 320 includes metal structures 380a and 380b, via contacts 314 and 375, top plate 350, dielectric 355, and bottom plate 360. The sub-capacitor 340 includes metal structures 380a and 380b, via contacts 314 and 375, top plate 350, dielectric layer 355, and bottom plate 360. A metal structure 380c and the outside via contact 375a may be disposed between the sub-capacitors 320 and 340. The sub-capacitor 320 includes a plurality of trenches 312b that are not shown for simplicity.

The metal structures 380a and 380c may be connected to metal layers 305 and carry the first voltage (e.g., VSS). The metal structures 380b may be connected to the metal layer 304 and carry the second voltage (e.g., VDD). The outside via contacts 375 may be connected to the metal structures 380a and the bottom plate 360. The via contacts 314 may be connected to the metal structures 380b and the top plate 350. The outside via contact 375a may be connected to the metal structure 380c and the bottom plate 360.

The top plate 350 may be connected to the second voltage via the via contacts 314 and the metal structures 380b. Also, the bottom plate 360 may be connected to the first voltage via the outside via contacts 375 and 375a. Because there are multiple via contacts 375 and 375a connected to the bottom plate 360 (e.g., between chips 110 and/or voltage supplies), the ESR of the trenches 312a and 312b may be reduced and the AC capacitance density may be increased.

Figure 5:
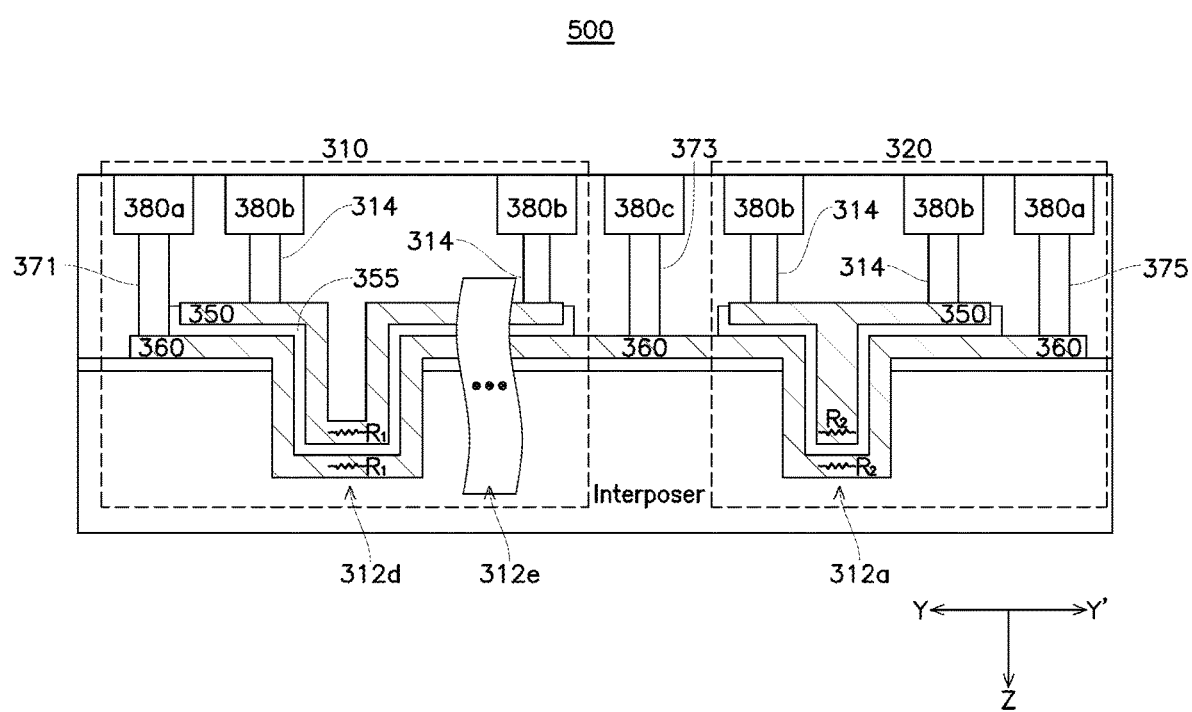
FIG. 5 illustrates a side view of the layout design along the line Y-Y' of FIG. 3, in accordance with embodiments.

FIG. 5 illustrates a side view 500 of the layout design 300 along the line Y-Y' of FIG. 3, in accordance with embodiments. The side views 400 and 500 are similar except that the side view 500 shows different sub-capacitors and via contacts. Accordingly, similar descriptions are omitted for clarity and simplicity. Signals traversing between the sub-capacitor 310 and the sub-capacitor 320 also traverse a plurality of first trenches (e.g., trenches 312d and 312e) and a second trench (e.g., trench 312a).

The side view 500 includes the sub-capacitor 310 and the sub-capacitor 320. The via contact 373 is disposed between the sub-capacitors 310 and 320, and the via contact 373 is connected to the metal structure 380c. Accordingly, the ESR for a signal traversing between the metal structure 380a of the sub-capacitor 310 and the metal structure of the 380a of the sub-capacitor 320 (e.g., between chips 110 and/or voltage supplies) may be reduced.

Figure 6:
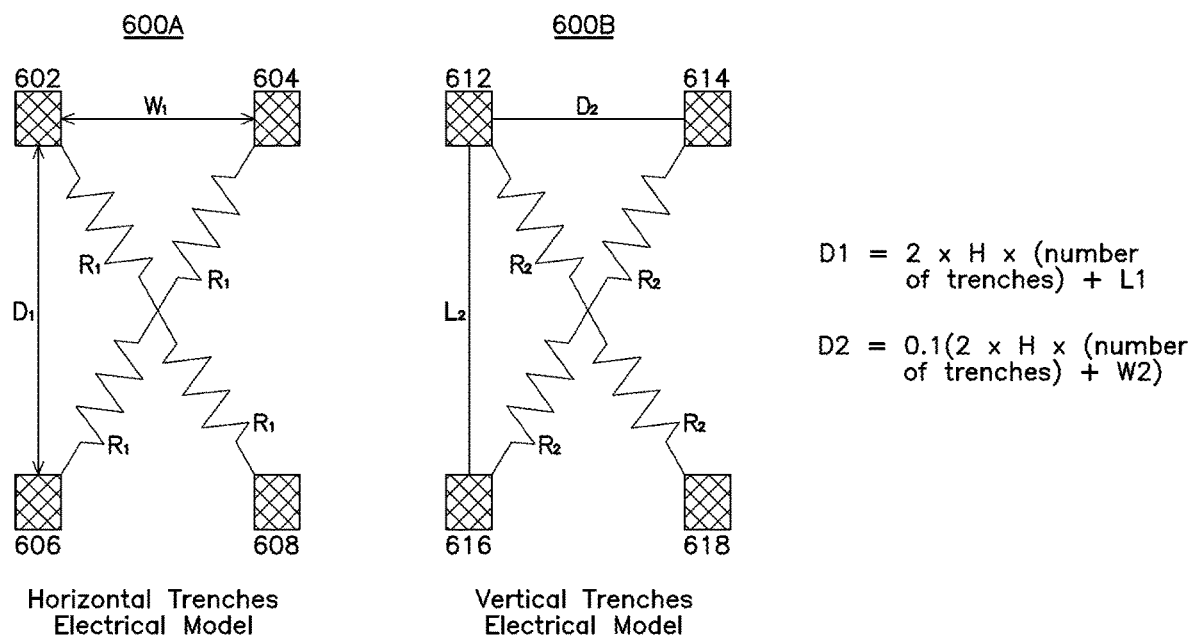
FIG. 6 illustrates electrical models of the plates of the sub-capacitor and the plates of the sub-capacitor of FIG. 3, according to some embodiments.

FIG. 6 illustrates electrical models 600A and 600B of the plates of the sub-capacitor 320 and the plates of the sub-capacitor 340 of FIG. 3, according to some embodiments. These electrical models are examples of models that can be used to approximate or model the ESR that each sub-capacitor may provide. For example, the electrical model 600A may be used to model the ESR between the via contacts 602, 604, 606, and 608, and the electrical model 600B may be used to model the ESR between the via contacts 612, 614, 616 and 618.

Referring to electrical model 600A, via contacts 602-608 may correspond to the via contacts of FIGS. 2-5 (e.g., via contacts 204, 314, 371-375). For example, the via contacts 602 and 604 may correspond to two adjacent via contacts 314 on one side of the horizontal trenches 312d and via contacts 606 and 608 may correspond to two adjacent via contacts 314 on the opposing side of the horizontal trenches 312d. Width $W_1$ indicates the width between the via contacts 602 and 604 or between via contacts 606 and 608. Depth $D_1$ represents the distance that the top and bottom plates extend, including the entire height H of the trenches and the length $L_1$ between the via contacts 602 and 606 or between via contacts 604 and 608. Resistance $R_1$ (sometimes referred to as equivalent series resistance (ESR)) represents the resistance of the top and bottom plates.

Referring to electrical model 600B, via contacts 612-618 may correspond to the via contacts of FIGS. 2-5 (e.g., via contacts 204, 314, 371-375). For example, the via contacts 612 and 614 may correspond to two adjacent via contacts 314 on one side of the vertical trenches 312a and via contacts 616 and 618 may correspond to two adjacent via contacts 314 on the opposing side of the horizontal trenches 312a. Width $W_2$ indicates the width between the via contacts 612 and 614 or between via contacts 616 and 618. Depth $D_2$ represents the distance that the top and bottom plates extend, including the entire height H of the trenches and the length $L_2$ between the via contacts 612 and 616 or between via contacts 614 and 618. Resistance $R_2$ (ESR) represents the resistance of the top and bottom plates.

As the distance between the via contacts decreases, the various values such as $W_1$ and/or $W_2$, $D_1$ and/or $D_2$, and $L_1$ and/or $L_2$ also decrease. This advantageously reduces the resistance in the top and bottom plates. In the disclosed technology, $R_1$ may equal $a \times R_2$, where a is any number between 1 to 5. In the present disclosure, the $R_1$ and $R_2$ may be reduced due to the increase in the number of via contacts and the location of the via contacts.

Figure 7:
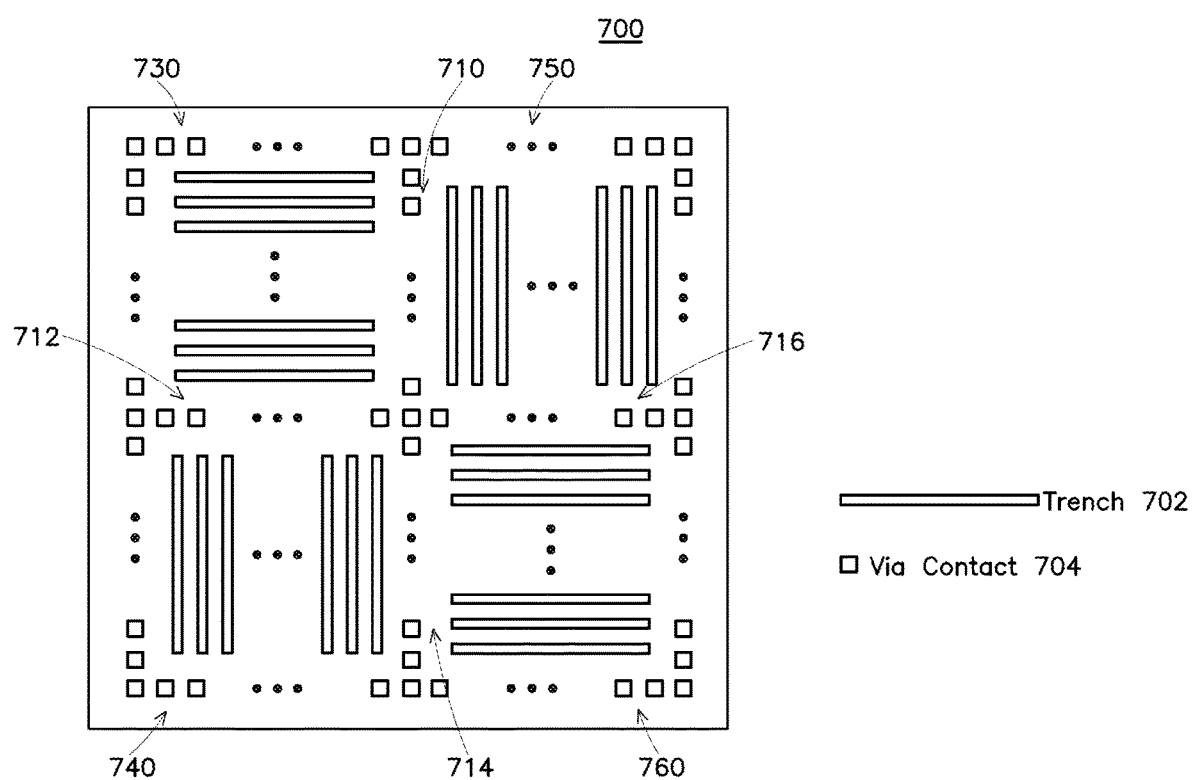
FIG. 7 illustrates an example design of trenches and via contacts, in accordance with some embodiments.

FIG. 7 illustrates an example design 700 of trenches 702 and via contacts 704, in accordance with some embodiments. The example design 700 is similar to the example design 200 of FIG. 2, except that the sub-capacitors share via contacts therebetween. For example, sub-capacitor 730 (e.g., sub-capacitor 210) and sub-capacitor 750 (e.g., sub-capacitor 230) share via contacts 710 therebetween. Similarly, sub-capacitor 740 (e.g., sub-capacitor 220) and sub-capacitor (e.g., sub-capacitor 240) share via capacitors 714 therebetween. Also, the sub-capacitors 730 and 740 share via contacts 712 therebetween, and the sub-capacitors 750 and 760 share via capacitors 716 therebetween. Because example design 700 includes via capacitors 710-716 that are shared between adjacent sub-capacitors 730-760, the area is smaller than the example design 200.

Figure 8:
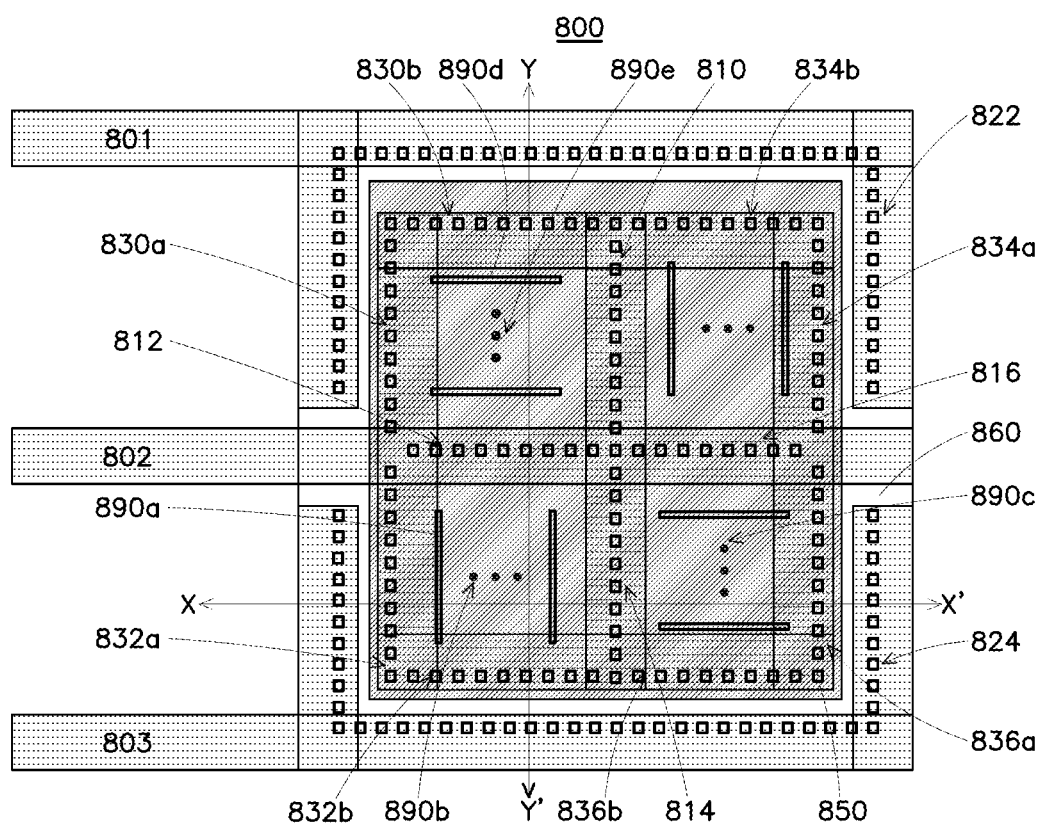
FIG. 8 illustrates a layout design of a package including the example design of FIG. 7, in accordance with some embodiments.

FIG. 8 illustrates a more detailed layout design 800 of a package including the example design 700 of FIG. 7, in accordance with some embodiments. For example, sub-capacitors 830a, 830b may be similar to the sub-capacitors 730 of FIG. 7, but FIG. 8 also illustrates metal layers that correspond to top and bottom plates of the sub-capacitors 830a, 830b. The layout design 800 is similar to the layout design 300 of FIG. 3, except that the layout design 800 includes shared via contacts 810, 812, 814, and 816 (e.g., via contacts 710-716 of FIG. 7) and there are three metal layers 801, 802, and 803 due to the shared via contacts 810-816. The shared via contacts 810-816 are connected to the top plate 850, and outside via contacts 822 and 824 are connected to the bottom plate 860. The layout design 800 also includes trenches 890c, 890d and 890e having the first orientation and trenches 890a and 890b having the second orientation.

The layout design 800 also includes inner via contacts 830a, 830b, 832a, 832b, 834a, 834b, 836a, and 836b. The inner via contacts 830a-836a are aligned in the Y-Y' direction, and the inner via contacts 830b-836b are aligned in the X-X' direction. The inner via contacts 830a-836b form a square perimeter around the trenches. For example, the inner via contacts 830a and 830b surround an outer portion of the trenches in the top left quadrant of the layout design 800 (e.g., trenches to the top left of the shared trenches 810 and 812), the inner via contacts 832a and 832b surround an outer portion of the trenches in the bottom left quadrant (e.g., trenches to the bottom left of the shared trenches 810 and 812), the inner via contacts 834a and 834b surround an outer portion of the trenches in the top right quadrant (e.g., trenches to the top right of the shared trenches 810 and 812), and the inner via contacts 836a and 836b surround an outer portion of the trenches in the bottom right quadrant (e.g., trenches to the bottom right of the shared trenches 810 and 812).

Figure 9:
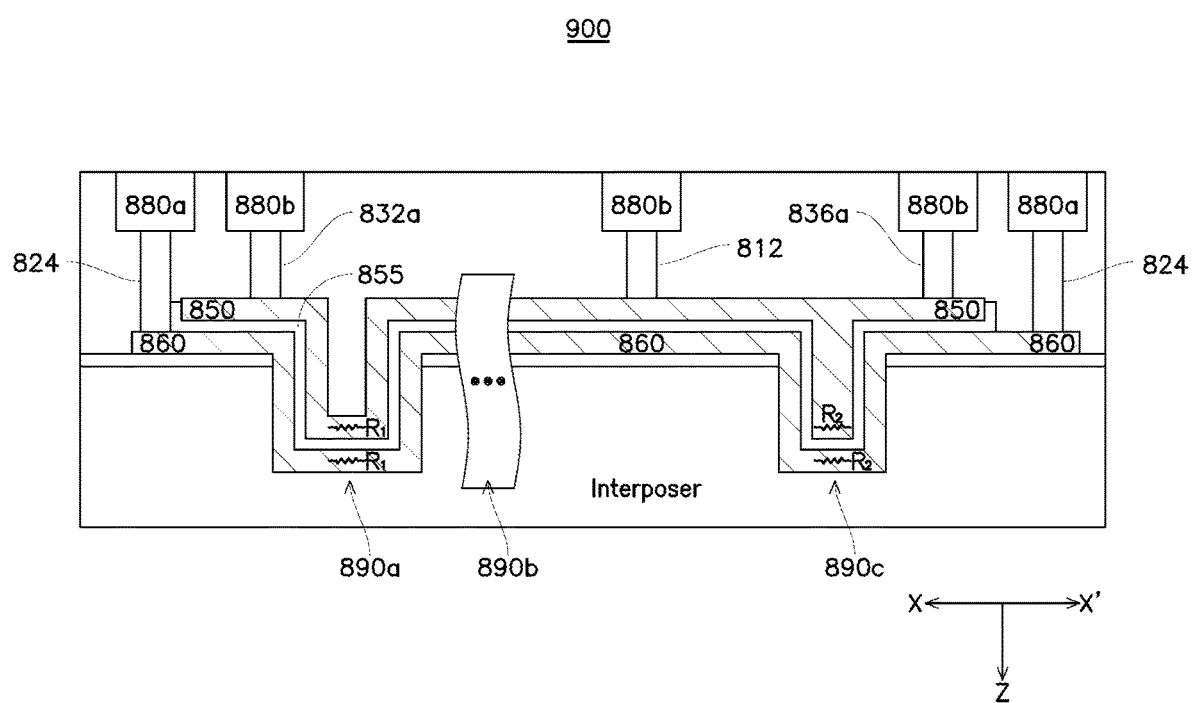
FIG. 9 illustrates a side view of the layout design along the line X-X' of FIG. 8, in accordance with some embodiments.

FIG. 9 illustrates a side view 900 of the layout design 800 along the line X-X' of FIG. 7, in accordance with some embodiments. The side view 900 is similar to the side view 400 except that there are fewer via contacts and the top plate is connected between sub-capacitors. Trenches 890a and 890b having the second orientation and trench 890c having the first orientation are connected together as one capacitor, where the top plate 850, a dielectric layer 855, and the bottom plate 860 form the capacitor. Via contacts 824 are connected to the bottom plate 860, and the metal structures 880a are connected to the via contacts 824. Inner via contacts 832a and 836a and the shared via contact 812 are connected to the top plate 850, and metal structures 880b are connected to the inner via contacts 832a and 836a and the shared via contact 812. Accordingly, because there are fewer via contacts than the layout design of FIGS. 2-5, a package area may be saved while still providing the advantages of reducing the ESR.

Figure 10:
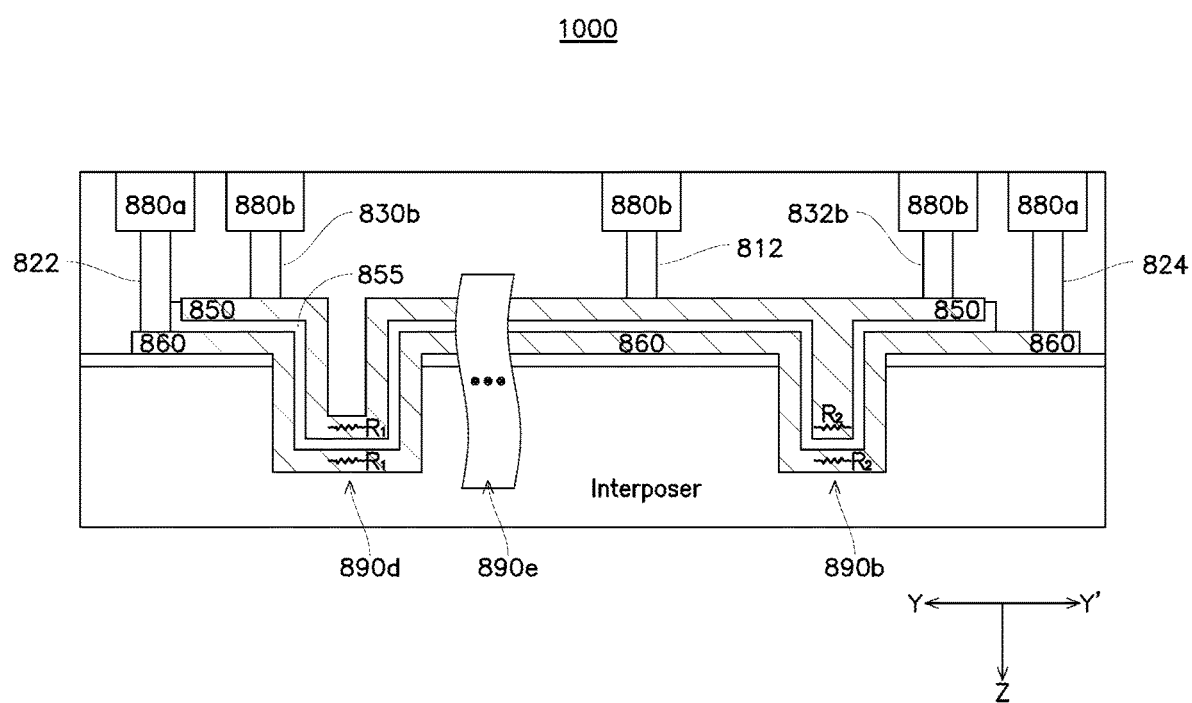
FIG. 10 illustrates a side view of the layout design along the line Y-Y' of FIG. 8, in accordance with embodiments.

FIG. 10 illustrates a side view 1000 of the layout design 800 along the line Y-Y' of FIG. 7, in accordance with embodiments. The side view 1000 is similar to the side view 500 except that there are fewer via contacts and the top plate is connected between sub-capacitors. Trenches 890d and 890e and trench 890b are connected together as one capacitor including the top plate 850, a dielectric layer 855, and the bottom plate 860. Via contacts 822 and 824 are connected to the bottom plate 860, and the metal structures 880a are connected to the via contacts 822 and 824. Inner via contacts 830b and 832b and the shared via contact 812 are connected to the top plate 850, and metal structures 880b are connected to the inner via contacts 830b and 832b and the shared via contact 812. Accordingly, because there are fewer via contacts than the layout design of FIGS. 2-5, a package area may be saved while still providing the advantages of reducing the ESR.

Figure 11:
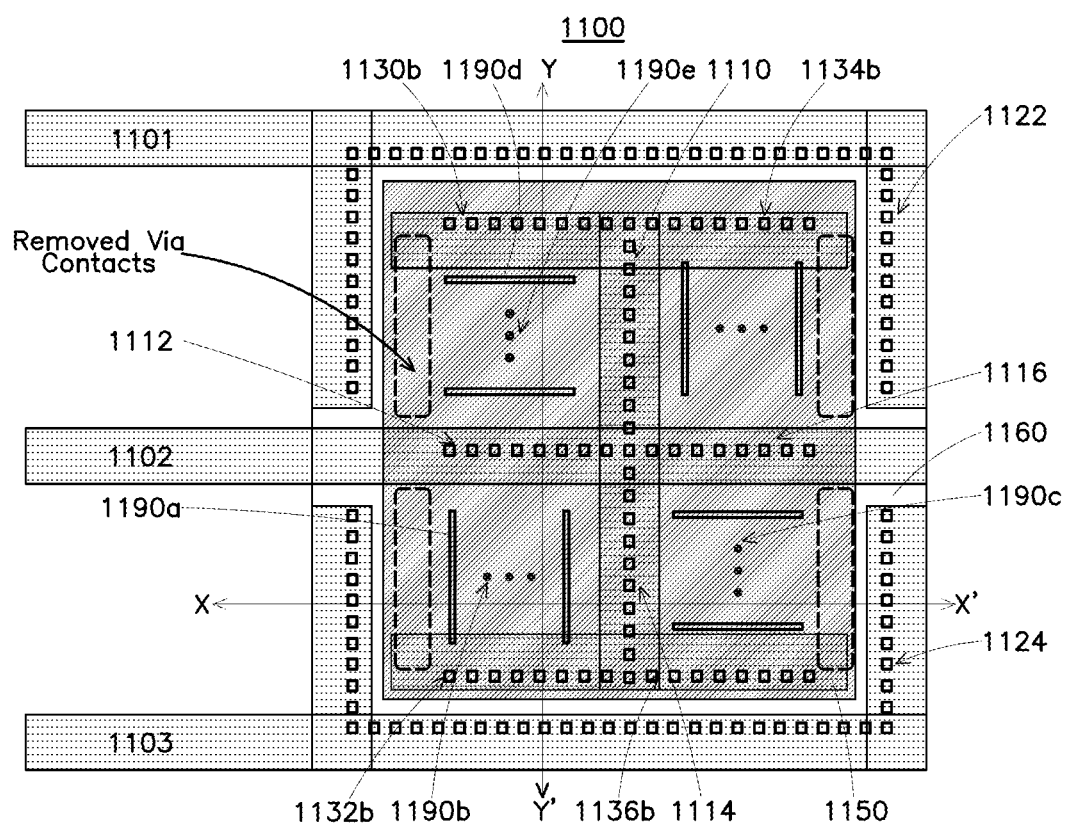
FIG. 11 illustrates a layout design of a package, in accordance with some embodiments.

FIG. 11 illustrates a layout design 1100 of a package, in accordance with some embodiments. The layout design 1100 is similar to the layout design 800 of FIG. 8, except that the layout design 1100 does not include inner via contacts that are aligned in the y-direction. For example, the inner via contacts 830a, 832a, 834a, and 836a of FIG. 8 do not have corresponding structures in layout design 1100. The shared via contacts 1110-1116 are connected to the top plate 1150, and outside via contacts 1122 and 1124 are connected to the bottom plate 1160. The layout design 1100 also includes trenches 1190c, 1190d and 1190e having the first orientation and trenches 1190a and 1190b having the second orientation.

The layout design 1100 also includes inner via contacts 1130b, 1132b, 1134b, and 1136b. The inner via contacts 1130b-1136b are aligned in the X-X' direction. The inner via contacts 1130b-1136b form a square perimeter around the trenches. For example, the inner via contacts 1130b surround an outer portion of the trenches in the top left quadrant of the layout design 1100 (e.g., trenches to the top left of the shared trenches 1110 and 1112), the inner via contacts 1132b surround an outer portion of the trenches in the bottom left quadrant (e.g., trenches to the bottom left of the shared trenches 1110 and 1112), the inner via contacts 1134b surround an outer portion of the trenches in the top right quadrant (e.g., trenches to the top right of the shared trenches 1110 and 1112), and the inner via contacts 1136b surround an outer portion of the trenches in the bottom right quadrant (e.g., trenches to the bottom right of the shared trenches 1110 and 1112).

Accordingly, unlike the layout design 800 of FIG. 8, the inner via contacts are only formed aligned in the x-direction. The removal of the inner via contacts aligned in the y-direction may reduce an area compared to that of the layout design 800 while still decreasing the ESR and raising the AC capacitance density.

Figure 12:
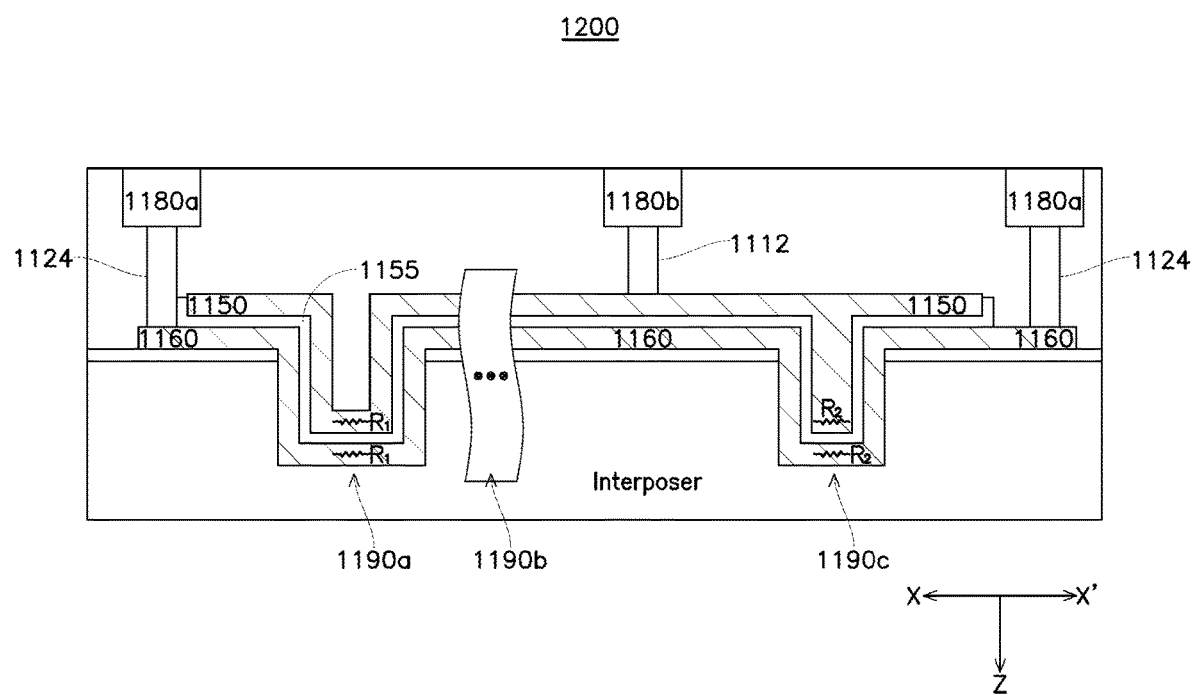
FIG. 12 illustrates a side view of the layout design along the line X-X' of FIG. 11, in accordance with some embodiments.

FIG. 12 illustrates a side view 1200 of the layout design 1100 along the line X-X' of FIG. 11, in accordance with some embodiments. The side view 1200 is similar to the side view 900 except that there are fewer via contacts and the top plate is connected between sub-capacitors. Trenches 1190a and 1190b having the second orientation and trench 1190c having the first orientation are connected together as one capacitor, where the top plate 1150, a dielectric layer 1155, and the bottom plate 1160 form the capacitor. Via contacts 1124 are connected to the bottom plate 1160, and the metal structures 1180a are connected to the via contacts 1124. The shared via contact 1112 is connected to the top plate 1150, and metal structure 1180b is connected to the shared via contact 1112. Accordingly, because there are fewer via contacts than the layout design of FIGS. 8-10, a package area may be saved while still providing the advantages of reducing the ESR.

Figure 13:
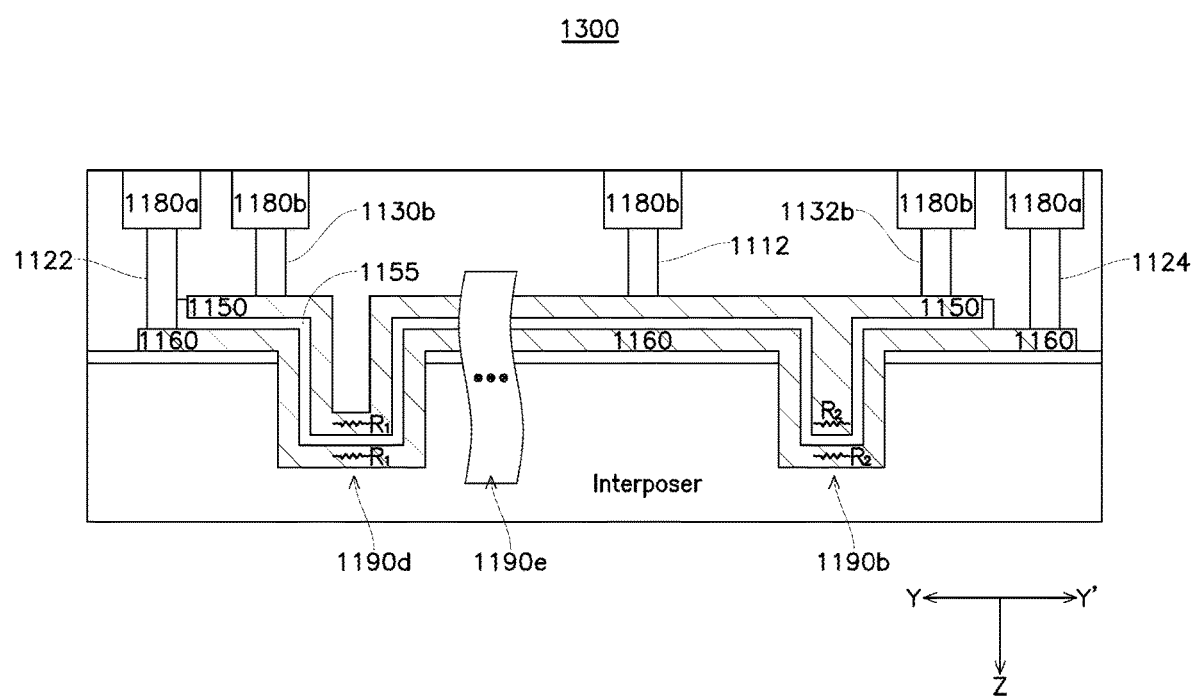
FIG. 13 illustrates a side view of the layout design along the line Y-Y', in accordance with embodiments.

FIG. 13 illustrates a side view 1300 of the layout design 1100 along the line Y-Y' of FIG. 11, in accordance with embodiments. The side view 1300 is similar to the side view 1000. Trenches 1190d and 1190e and trench 1190b are connected together as one capacitor including the top plate 1150, a dielectric layer 1155, and the bottom plate 1160. Via contacts 1122 and 1124 are connected to the bottom plate 1160, and the metal structures 1180a are connected to the via contacts 1122 and 1124. Inner via contacts 1130b and 1132b and the shared via contact 1112 are connected to the top plate 1150, and metal structures 1180b are connected to the inner via contacts 1130b and 1132b and the shared via contact 1112. Accordingly, because there are fewer via contacts than the layout design of FIGS. 8-10, a package area may be saved while still providing the advantages of reducing the ESR.

Figure 14:
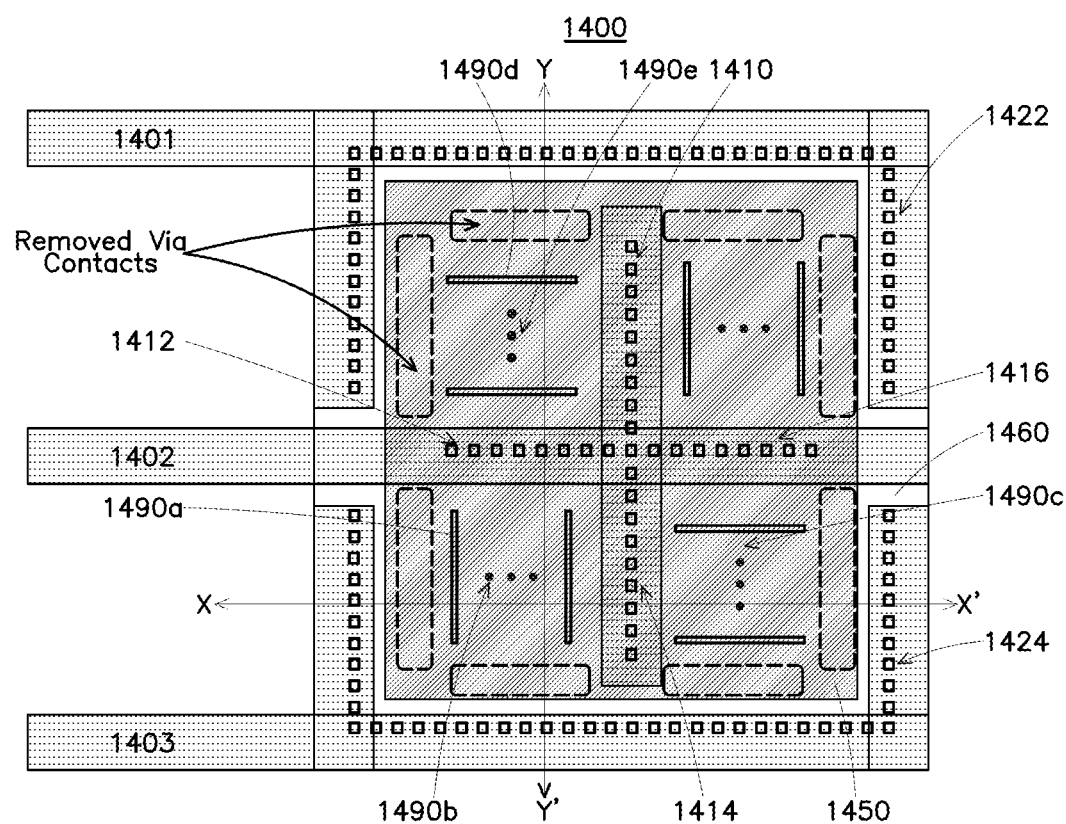
FIG. 14 illustrates a layout design of a package, in accordance with some embodiments.

FIG. 14 illustrates a layout design 1400 of a package, in accordance with some embodiments. The layout design 1400 is similar to the layout design 1100 of FIG. 11, except that the layout design 1400 does not include inner via contacts that are aligned in the y-direction. For example, the inner via contacts 1130b, 1132b, 1134b, and 1136b of FIG. 11 do not have corresponding structures in layout design 1400. For example, none of the inner contacts of the layout design 800 of FIG. 8 or layout design 1100 of FIG. 11 have corresponding features in FIG. 14. The shared via contacts 1410-1416 are connected to the top plate 1450, and outside via contacts 1422 and 1424 are connected to the bottom plate 1460. The layout design 1400 also includes trenches 1490c, 1490d and 1490e having the first orientation and trenches 1490a and 1490b having the second orientation.

Accordingly, unlike the layout design 1100 of FIG. 11, no inner via contacts are formed. The removal of the inner via contacts may reduce an area compared to that of the layout design 1100 while still decreasing the ESR and raising the AC capacitance density.

Figure 15:
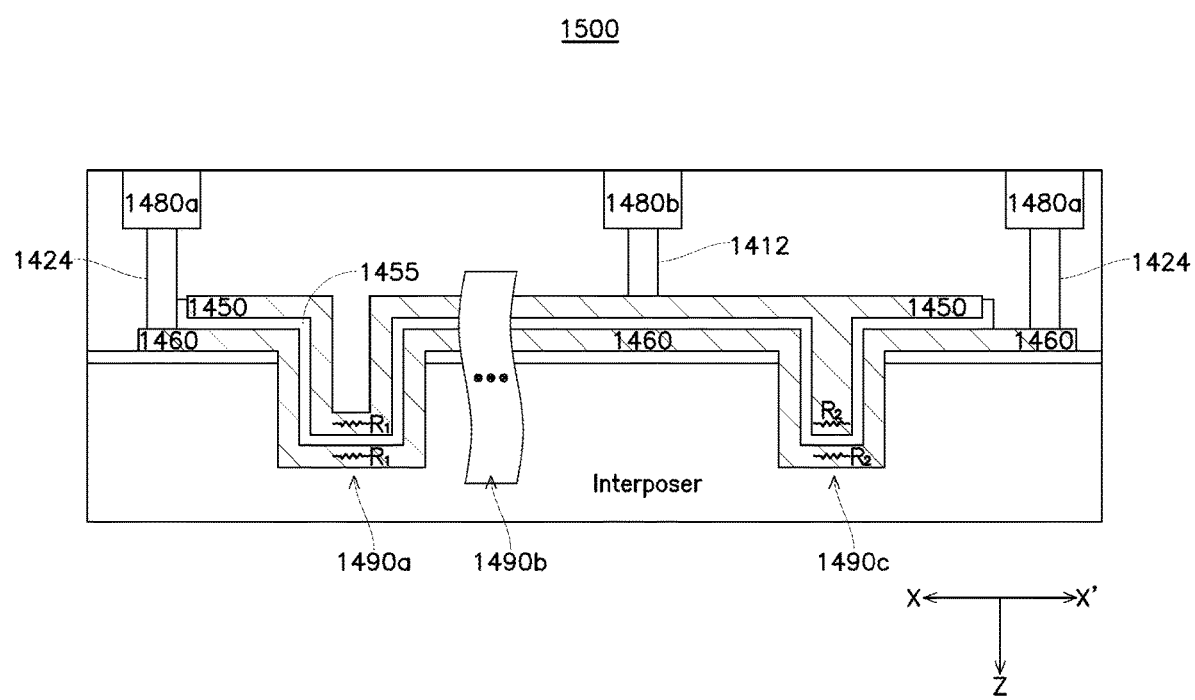
FIG. 15 illustrates a side view of the layout design along the line X-X' of FIG. 14, in accordance with some embodiments.

FIG. 15 illustrates a side view 1500 of the layout design 1400 along the line X-X' of FIG. 14, in accordance with some embodiments. The side view 1500 is similar to the side view 1200 except that there are fewer via contacts and the top plate is connected between sub-capacitors. Trenches 1490a and 1490b having the second orientation and trench 1490c having the first orientation are connected together as one capacitor, where the top plate 1450, a dielectric layer 1455, and the bottom plate 1460 form the capacitor. Via contacts 1424 are connected to the bottom plate 1460, and the metal structures 1480a are connected to the via contacts 1424. The shared via contact 1412 is connected to the top plate 1450, and metal structure 1480b is connected to the shared via contact 1412. Accordingly, because there are fewer via contacts than the layout design of FIGS. 11-13, a package area may be saved while still providing the advantages of reducing the ESR.

Figure 16:
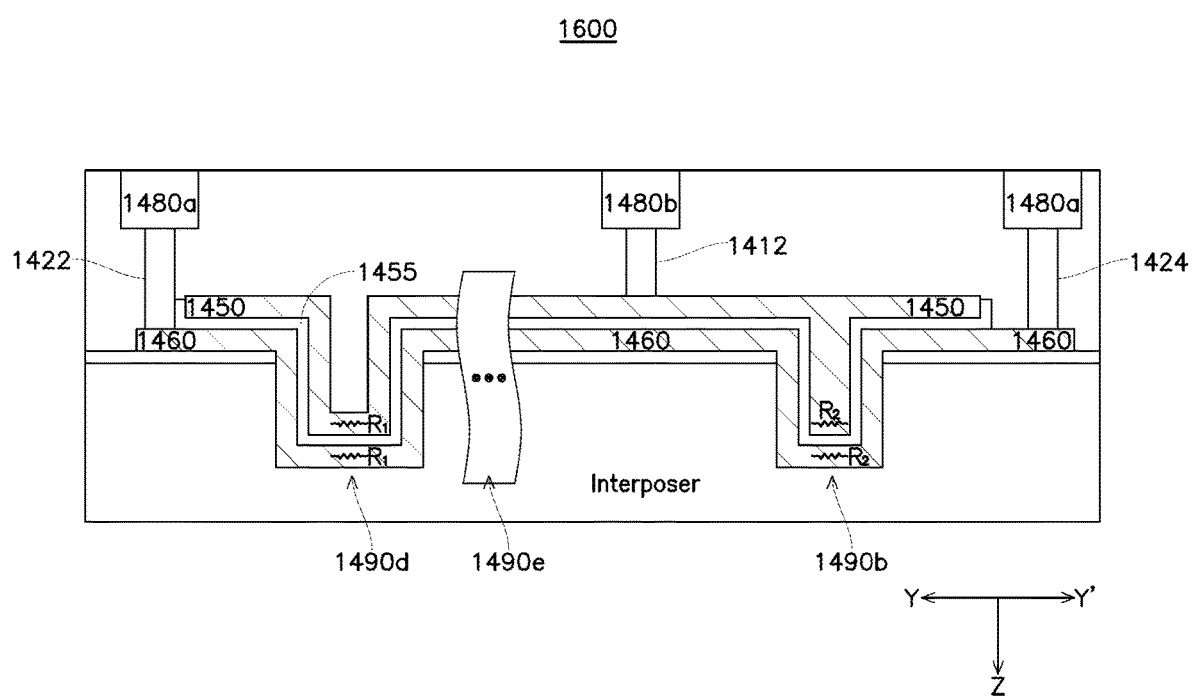
FIG. 16 illustrates a side view of the layout design along the line Y-Y' of FIG. 14, in accordance with embodiments.

FIG. 16 illustrates a side view 1600 of the layout design 1400 along the line Y-Y' of FIG. 14, in accordance with embodiments. The side view 1600 is similar to the side view 1300. Trenches 1490d and 1490e and trench 1490b are connected together as one capacitor including the top plate 1450, a dielectric layer 1455, and the bottom plate 1460. Via contacts 1422 and 1424 are connected to the bottom plate 1460, and the metal structures 1480a are connected to the via contacts 1422 and 1424. The shared via contact 1412 are connected to the top plate 1450, and metal structures 1480b are connected to the shared via contact 1412. Accordingly, because there are fewer via contacts than the layout design of FIGS. 11-13, a package area may be saved while still providing the advantages of reducing the ESR.

Figure 17:
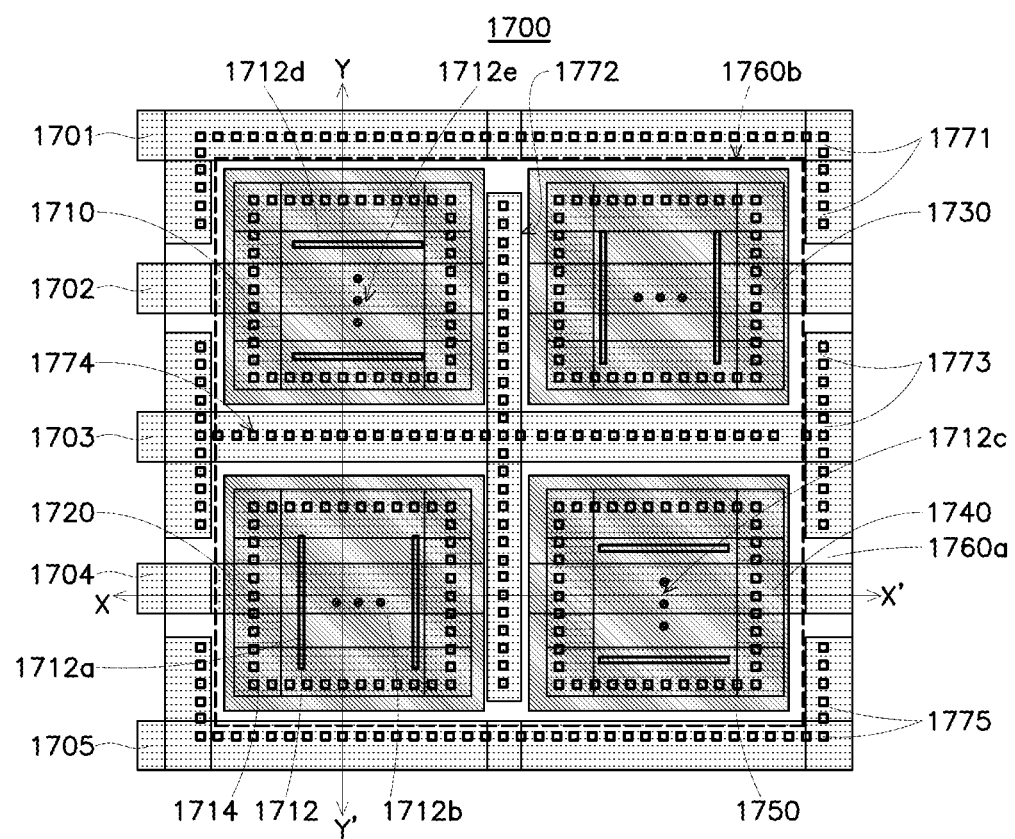
FIG. 17 illustrates a layout design of a package, in accordance with some embodiments.

FIG. 17 illustrates a layout design 1700 of a package, in accordance with some embodiments. The layout design 1700 is similar to the layout design 300 except that the layout design 1700 includes a middle plate 1760b for the capacitor as well as additional via contacts. The layout design 1700 may include a plurality of metal layers 1701, 1702, 1703, 1704, and 1705, a plurality of sub-capacitors 1710, 1720, 1730, and 1740, a top plate 1750, a bottom plate 1760a, a middle plate 1760b, and a plurality of outside via contacts 1771, 1772, 1773, 1774, and 1775. Although the layout design 1700 includes a certain number of features and a certain shape, embodiments are not limited thereto, and the layout design may have varying number of features and varying shapes.

The metal layers 1701-1705 may be disposed within the interposer (e.g., interposer 120) and carry electrical signals. For example, the metal layers 1701, 1702, 1704, and 1705 may carry the voltage supply VSS, and the metal layer 1703 may carry the voltage supply VDD. The metal layers 1701-1705 may be electrically connected to the chips (e.g., chips 110) that are disposed above the interposer. The metal layers 1701-1705 may be disposed on the same or different levels. For example, the metal layer 1701 may be a different metal layer than the metal layer 1702, etc.

The sub-capacitors 1710-1740 may be similar to the sub-capacitors 210-240 of FIG. 2, respectively. For example, each of the sub-capacitors 1710-1740 may include a plurality of trenches (e.g., DTCs) 1712 that are formed adjacent to one another, either having the first orientation or the second orientation. Furthermore, each of the groups of trenches 1712 may be surrounded by a plurality of via contacts 1714 that are connected to the top, bottom or middle plates 1750, 1760a, or 1760b via metal structures (not shown).

The top plate 1750 may be disposed within the interposer and function as a first plate of a capacitor (e.g., DTC). The bottom plate 1760a may be disposed below the top plate 1750 and also function as the first plate of the capacitor. The middle plate 1760b may be disposed between the top plate 1750 and the bottom plate 1760a and function as the second plate of the capacitor. Although not shown, a dielectric layer formed of high-k dielectric material may be disposed between the top plate 1750 and the middle plate 1760b and between the middle plate 1760b and the bottom plate 1760a. Accordingly, the top, middle, and bottom plates 1750, 1760b, and 1760a and the dielectric layers (not shown) may form a capacitor (e.g., DTC). Although layout design 1700 shows that one large middle plate 1760b is formed to form the sub-capacitors 1710-1740, embodiments are not limited thereto, and one middle plate may be formed for each sub-capacitor 1710-1740, similar to the top plates 1750.

The outside via contacts 1771, 1772, 1774, and 1775 may be connected to the top and bottom plates 1750 and 1760a. For example, the outside via contacts 1771 and 1775 may transmit a first voltage (e.g., first power supply voltage VSS) and be connected to the bottom plate 1760b. The via contacts 1714 may transmit the first voltage and be connected to the top plate 1750. The outside via contacts 1772, 1773, and 1774 may transmit a second voltage (e.g., second power supply voltage VDD) and be connected to the middle plate 1760b. In some embodiments, the outside via contacts 1771, 1775 and via contacts 1714 may transmit the second voltage, and the via contacts 1772-1774 may transmit the first voltage. Although the examples in the figures are described with respect to transmitting power supply voltages VSS and VDD, embodiments are not limited thereto. For example, the outside via contacts 1771-1775 and via contacts 1714 may be connected to differential input/output signal pairs and/or single-ended input/output signals.

Furthermore, in layout design 1700, the metal layers 1702 and 1704 do not fully extend in the x-direction to overlap the sub-capacitors 1710 and 1730 (for metal layer 1702) and the sub-capacitors 1720 and 1740 (for metal layer 1704). This is also different from FIG. 3, where the metal layers 302 and 304 fully extend in the x-direction.

Figure 18:
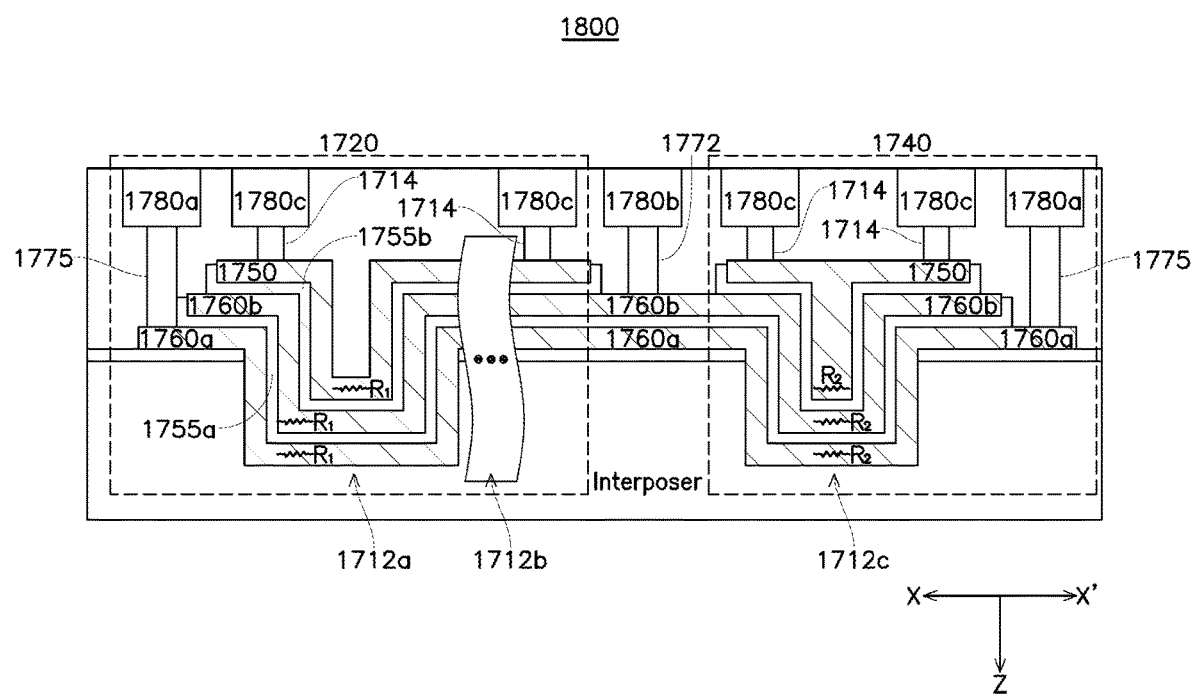
FIG. 18 illustrates a side view of the layout design along the line X-X' of FIG. 17, in accordance with some embodiments.

FIG. 18 illustrates a side view 1800 of the layout design 1700 along the line X-X' of FIG. 17, in accordance with some embodiments. The side view 1800 shows a portion of the layout design 1800 including the interposer and the sub-capacitors 1720 and 1740. Both the sub-capacitors 1720 and 1740 includes metal structures 1780a and 1780c, via contacts 1714 and 1775, top plate 1750, middle plate 1760b, bottom plate 1760a, and dielectric layers 1755a and 1755b. The layout design 1700 also includes a metal structure 1780b and the outside via contact 1772 disposed between the sub-capacitors 1720 and 1740. The sub-capacitor 1720 includes a plurality of trenches 1712b that are not shown for simplicity.

The metal structures 1780a may be connected to metal layer 1705, and the metal structure 1780c may be connected to metal layer 1704. Both metal structures 1780a and 1780c may carry the first voltage (e.g., VSS). The metal structures 1780b may be connected to the metal layer 1703 and carry the second voltage (e.g., VDD). The outside via contacts 1775 may be connected to the metal structures 1780a and the bottom plate 1760a. The via contacts 1714 may be connected to the metal structures 1780c and the top plate 1750. The outside via contact 1772 may be connected to the metal structure 1780b and the middle plate 1760b. Because there are multiple via contacts 1775 and 1714 connected to the top and bottom plates 1750 and 1760a (e.g., between chips 110 and/or voltage supplies), the ESR of the trenches 1712a and 1712b may be reduced and the AC capacitance density may be increased.

Figure 19:
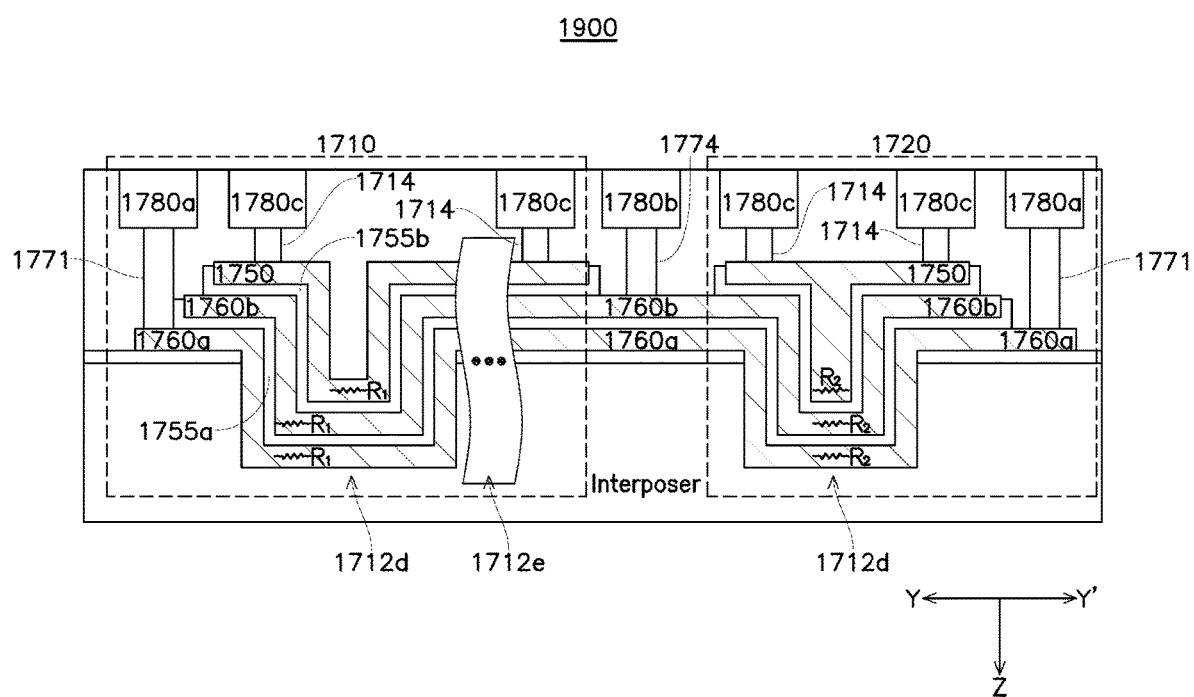
FIG. 19 illustrates a side view of the layout design along the line Y-Y' of FIG. 17, in accordance with embodiments.

FIG. 19 illustrates a side view 1900 of the layout design 1700 along the line Y-Y' of FIG. 17, in accordance with embodiments. The side view 1800 shows a portion of the layout design 1800 including the interposer and the sub-capacitors 1710 and 1720. Both the sub-capacitors 1710 and 1720 includes metal structures 1780a and 1780c, via contacts 1714 and 1771, top plate 1750, middle plate 1760b, bottom plate 1760a, and dielectric layers 1755a and 1755b. The layout design 1700 also includes a metal structure 1780b and the outside via contact 1774 disposed between the sub-capacitors 1710 and 1720. The sub-capacitor 1720 includes a plurality of trenches 1712e that are not shown for simplicity.

The metal structures 1780a may be connected to metal layer 1705, and the metal structure 1780c may be connected to metal layer 1704. Both metal structures 1780a and 1780c may carry the first voltage (e.g., VSS). The metal structures 1780b may be connected to the metal layer 1703 and carry the second voltage (e.g., VDD). The outside via contacts 1771 may be connected to the metal structures 1780a and the bottom plate 1760a. The via contacts 1714 may be connected to the metal structures 1780c and the top plate 1750. The outside via contact 1774 may be connected to the metal structure 1780b and the middle plate 1760b. Because there are multiple via contacts 1771 and 1714 connected to the top and bottom plates 1750 and 1760a (e.g., between chips 110 and/or voltage supplies), the ESR of the trenches 1712d and 1712e may be reduced and the AC capacitance density may be increased.

FIG. 20 illustrates an example table 2100 that shows gains in the capacitance density, in accordance with some embodiments. Three parameters are compared for the layout designs 300, 800, 1100, and 1400 against baseline measurements. The first parameter of a direct current (DC) capacitance density may be determined by the overall capacitor size. The second parameter of the AC capacitance density may be determined by the effective ESR of each individual plate and contact location. The area is the difference in the layout areas. The overall chip frequency may be determined by the overall AC capacitance across the design. Although specific numbers are shown in table 2100, embodiments are not limited thereto, and the actual measurements may vary, depending on a variety of factors.

As shown in the table 2100, the DC capacitance density decreases when fewer via contacts are used. For example, design 300 has the most via contacts, design 800 has the second most, design 1100 has the third most, and the design 1400 has the least. However, the AC capacitance density at 200 MHz increases with more via contacts. According to some embodiments, the area increase is decreased as fewer via contacts are used. Accordingly, a chip designer or a manufacturer may pick and choose which package layout design they want to use. Furthermore, additional package layout designs that are not described in detail in this disclosure may also be contemplated.

Figure 21:
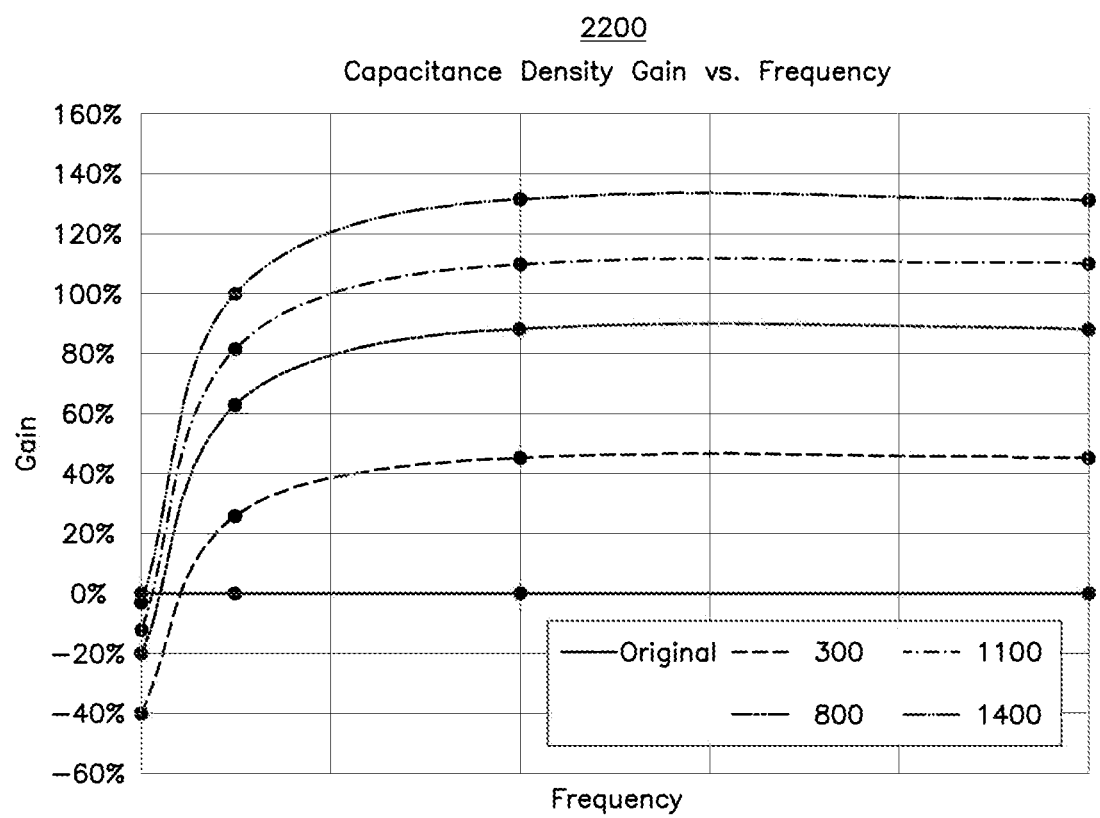
FIG. 21 illustrates an example graph of AC capacitance density gains of the various layout designs, in accordance with some embodiments.

FIG. 21 illustrates an example graph 2200 of AC capacitance density gains of the various layout designs (e.g., layout designs 300, 800, 1100, 1400), in accordance with some embodiments. For example, the graph 2200 shows an improvement in the capacitance of the various layout designs 300, 800, 1100, 1400 compared to the original that only uses trenches having one orientation. The graph 2200 shows the gain in the AC capacitance density as a function of package resonant frequency. The graph 2200 shows the curves of the layout designs 300, 800, 1100, and 1400 as well as the original (or baseline) design. Consistent with the table 2100, the layout design 1400 has the highest gain, the layout design 1100 has the second highest gain, the layout design 800 has the third highest gain, and the layout design 300 has the least gain. Although specific numbers are shown in graph 2200, embodiments are not limited thereto, and the actual measurements may vary, depending on a variety of factors.

Figure 22:
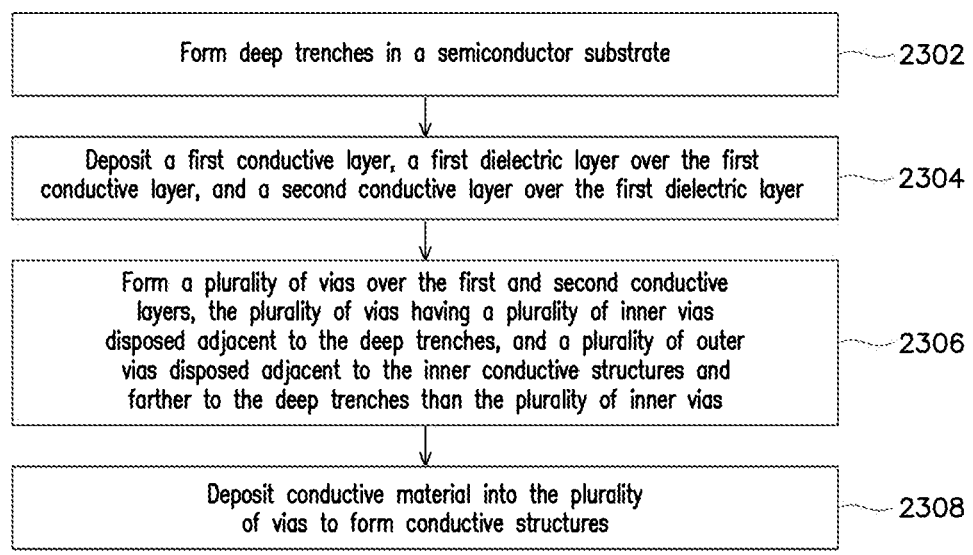
FIG. 22 illustrates a flowchart of an example method of fabricating a semiconductor package, in accordance with some embodiments.

FIG. 22 illustrates a flowchart of an example method 2300 of fabricating a semiconductor package, in accordance with some embodiments. The method 2300 may be used to fabricate a semiconductor package having high AC capacitance density. For example, at least some of the operations described in the method 2300 use design layouts 300, 800, 1100, 1400, or 1700. It is noted that the method 2300 is merely an example and is not intended to limit the present disclosure. Accordingly, it is understood that additional operations may be provided before, during, and after the method 2300 of FIG. 22, and that some other operations may only be briefly described herein.

In brief overview, the method 2300 starts with operation 2302 of forming deep trenches in a semiconductor substrate. The method 2300 proceeds to operation 2304 of depositing a first conductive layer, a first dielectric layer over the first conductive layer, and a second conductive layer over the first dielectric layer. The method 2300 proceeds to operation 2306 of forming a plurality of vias over the first and second conductive layers, the plurality of vias having a plurality of inner vias disposed adjacent to the deep trenches, and a plurality of outer vias disposed adjacent to the inner conductive structures and farther to the deep trenches than the plurality of inner vias. The method 2300 proceeds to operation 2308 of depositing conductive material into the vias to form conductive structures.

Referring to operation 2302, deep trenches (e.g., trenches 312a-e, 890a-890e, 1190a-1190e, 1490a-1490e, 1712a-1712e) are formed in a semiconductor substrate (e.g., interposer 120). The deep trenches may be formed using lithographic processes such as etching with photomasks.

Referring to operation 2304, a first conductive layer (e.g., bottom plate 360, 860, 1160, 1460, 1760a) is deposited over the semiconductor substrate including the trenches. Then a first dielectric layer (e.g., dielectric layer 355, 855, 1155, 1455, 1755a) is deposited over the first conductive layer. Then a second conductive layer (e.g., top plate 350, 850, 1150, 1450, middle plate 1760b) is formed over the first dielectric layer. In some embodiments, a second dielectric layer (e.g., dielectric layer 1755b) is formed over the second conductive layer, and a third conductive layer (e.g., conductive layer 1750) is formed over the second dielectric layer. The layers may be deposited using any known method of depositing materials.

Referring to operation 2306, a plurality of vias may be formed in the first and second conductive layers. The plurality of vias may include a plurality of inner vias (e.g. vias formed for via contacts 314, 812, 832a, 836a, 830b, 832b, 1112, 1130b, 1132b, 1412, 1714) disposed adjacent to the deep trenches. The plurality of vias may also include a plurality of outer vias (e.g., vias formed for via contacts 375, 375a, 371, 373, 375, 824, 822, 1124, 1122, 1424, 1422, 1775, 1772) that are disposed adjacent to the inner conductive structures and farther to the deep trenches than the plurality of inner vias.

Referring to operation 2308, the plurality of inner and outer vias may be filled with conductive materials such that via contacts are formed. Thereafter, metal structures may be formed over the via contacts, and the metal structures may be connected to the dies/chips (e.g., chips 110).

Figure 23:
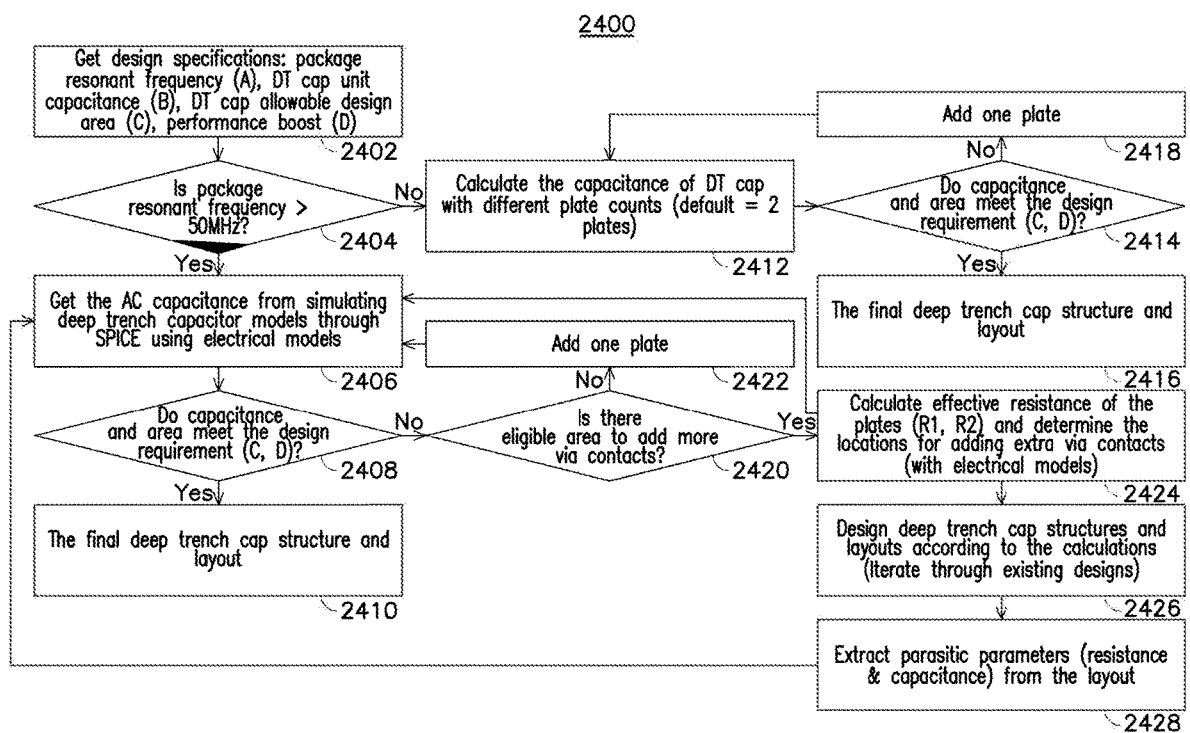
FIG. 23 illustrates a flowchart of another example method of manufacturing a semiconductor package, in accordance with some embodiments.

FIG. 23 illustrates a flowchart of another example method 2400 of manufacturing a semiconductor package, in accordance with some embodiments. The method 2400 may be used to design a semiconductor package having high AC capacitance density. For example, at least some of the operations described in the method 2400 use design layouts 300, 800, 1100, 1400, or 1700. It is noted that the method 2400 is merely an example and is not intended to limit the present disclosure. Accordingly, it is understood that additional operations may be provided before, during, and after the method 2400 of FIG. 23, and that some other operations may only be briefly described herein.

The method 2400 starts with operation 2402 of getting design specifications. The design specifications may include one or more of a package resonant frequency, a unit capacitance of a deep trench capacitor, the design area for the deep trenches (e.g., trenches 312a-e, 890a-890e, 1190a-1190e, 1490a-1490e, 1712a-1712e) and via contacts (e.g., via contacts 314, 812, 832a, 836a, 830b, 832b, 1112, 1130b, 1132b, 1412, 1714, 375, 375a, 371, 373, 375, 824, 822, 1124, 1122, 1424, 1422, 1775, 1772), and/or a desired performance boost. Once the specifications are determined, the method 2400 proceeds to operation 2404 where a determination is made of whether the package resonant frequency is greater than for example 50 MHz. If so, the method 2400 process to operation 2406. If not, the method 2400 proceeds to operation 2412. Even though the outcome of the operation 2404 is based on a specific number, embodiments are not limited thereto. For example, the determination may be made based on any package resonant frequency less than 50 Mhz or greater than 50 MHz.

During operation 2406, simulations are run to obtain the AC capacitance of the deep trench capacitor models through, e.g., simulation program with integrated circuit emphasis (SPICE) simulations. Once the simulations are run, the method 2400 proceeds to operation 2408 to determine whether the capacitance and area meet the design requirements. If so, the package design may be complete and the method 2400 may proceed to operation 2410 where the final structure and layout (e.g., layout designs 300, 800, 1100, 1400, 1700) of the package is obtained. If not, the method 2400 may proceed to operation 2420.

During operation 2420, a determination is whether there is available or eligible area to add more via contacts. If not, the method 2400 proceeds to operation 2422 of adding a capacitor plate (e.g., conductive plate 1750 of layout design 1700). Then the method 2400 proceeds to operation 2406 to repeat operation 2406 and later operations as needed. If there is available area to add more via contacts, the method 2400 proceeds to operation 2424.

During operation 2424, an effective resistance of the plates is calculated, and locations for additional via contacts (e.g., via contacts 314, 812, 832a, 836a, 830b, 832b, 1112, 1130b, 1132b, 1412, 1714, 375, 375a, 371, 373, 375, 824, 822, 1124, 1122, 1424, 1422, 1775, 1772) are determined using the electrical models as discussed in this disclosure. The calculations are complete and the locations are determined, the method 2400 proceeds to operation 2426 where the trench capacitors and layout are designed according to the calculations. The user may iterate through the various layout designs discussed in this disclosure. Once a design is picked, the method 2400 may proceed to operation 2428 of extracting the parasitic parameters (e.g., resistance and capacitance) from the layout. Then the method 2400 may proceed to operation 2406 to repeat operation 2406 and later operations as needed.

During the operation 2412 (when the package resonant frequency is not greater than 50 MHz), the method 2400 proceeds to operation 2412 of calculating the capacitance of the deep trench capacitors with different plate counts. For example, calculations are made with 3, 4, etc. plates. Then the method 2400 proceeds to operation 2412 where it is determined whether the capacitance and area meet the design requirements. If so, the method 2400 proceeds to operation 2416, and the design is complete (e.g., layout designs 300, 800, 1100, 1400, 1700). If not, the method 2400 proceeds to operation 2418 where an additional plate (e.g., conductive layer 1750 of layout design 1700) is added to the design. Then the method 2400 proceeds to operation 2412 where operation 2412 and later operations repeated as required.

In one aspect of the present disclosure, a semiconductor device is disclosed. The semiconductor device includes a semiconductor substrate having a plurality of first trenches extending along a first direction and a plurality of second trenches extending along a second direction that is perpendicular to the first direction, a first conductive layer disposed over the first and second trenches of the semiconductor substrate, a first dielectric layer disposed over the first conductive layer, a second conductive layer disposed over the first dielectric layer, a plurality of inner conductive structures disposed adjacent to the first and second trenches, and a plurality of outer conductive structures disposed adjacent to the plurality of inner conductive structures and farther to the first and second trenches than the plurality of inner conductive structures.

In another aspect of the present disclosure, a semiconductor package is disclosed. The semiconductor package includes a plurality of semiconductor dies disposed laterally with respect to one another, a silicon interposer disposed below plurality of semiconductor dies and electrically connected to the plurality of semiconductor dies, and a package substrate disposed below and electrically connected to the silicon interposer. The silicon interposed includes a semiconductor substrate having a plurality of first trenches extending along a first direction and a plurality of second trenches extending along a second direction that is perpendicular to the first direction, a first conductive layer disposed over the first and second trenches of the semiconductor substrate, a first dielectric layer disposed over the first conductive layer, a second conductive layer disposed over the first dielectric layer, a plurality of inner conductive structures disposed adjacent to the first and second trenches, and a plurality of outer conductive structures disposed adjacent to the plurality of inner conductive structures and farther to the first and second trenches than the plurality of inner conductive structures.

In yet another aspect of the present disclosure, a method of manufacturing a semiconductor package is disclosed. The method includes forming a plurality of deep trenches in a semiconductor substrate, depositing a first conductive layer over the deep trenches, a first dielectric layer over the first conductive layer, and a second conductive layer over the first dielectric layer, and forming a plurality of vias over the first and second conductive layers. The plurality of vias has a plurality of inner vias disposed adjacent to the deep trenches, and a plurality of outer vias disposed adjacent to the inner conductive structures and farther to the deep trenches than the plurality of inner vias. The method also includes depositing conductive material into the plurality of vias to form conductive structures.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate having a plurality of first trenches extending along a first direction and a plurality of second trenches extending along a second direction that is perpendicular to the first direction;
   a first conductive layer disposed over the first and second trenches of the semiconductor substrate;
   a first dielectric layer disposed over the first conductive layer;
   a second conductive layer disposed over the first dielectric layer;
   a plurality of inner conductive structures disposed adjacent to the first and second trenches, wherein a first subset of the plurality of inner conductive structures is disposed between the first and second trenches; and
   a plurality of outer conductive structures disposed adjacent to the plurality of inner conductive structures and farther to the first and second trenches than the plurality of inner conductive structures.

2. The semiconductor device of claim 1, wherein the plurality of conductive structures includes (1) a plurality of first conductive structures electrically connected to a first voltage and (2) a plurality of second conductive structures electrically connected to a second voltage, and wherein the plurality of first conductive structures are connected to the first conductive layer, and the plurality of second conductive structures are connected to the second conductive layer.

3. The semiconductor device of claim 1, wherein the plurality of inner conductive structures include a first subset of inner conductive structures that surround the plurality of first trenches and a second subset of inner conductive structures that surround the plurality of second trenches, and wherein a subset of the plurality of outer conductive structures are disposed between the first and second subsets of inner conductive structures.

4. The semiconductor device of claim 3, wherein the plurality of outer conductive structures are connected to the first conductive layer, and wherein the first and second inner conductive structures are connected to the second conductive layer.

5. The semiconductor device of claim 1, wherein a first portion of the first dielectric layer is disposed over a first portion of the first conductive layer overlapping the plurality of first trenches, a second portion of the first dielectric layer is disposed over a second portion of the first conductive layer overlapping the plurality of second trenches, and the first and second portions of the first dielectric layer are separated from each other, and
   wherein a subset of the plurality of conductive structures is disposed between the first and second portions of the first dielectric layer and connected to the first conductive layer.

6. The semiconductor device of claim 1, wherein the plurality of inner conductive structures include a subset of inner conductive structures that are arranged in a line and disposed between the first and second trenches.

7. The semiconductor device of claim 6, wherein the subset of inner conductive structures are connected to the second conductive layer.

8. The semiconductor device of claim 1, wherein the first subset of inner conductive structures is connected to the second conductive layer.

9. The semiconductor device of claim 1, wherein a second subset of the plurality of inner conductive structures is disposed in a line extending in the first direction and located between the first and second trenches and a first subset of the plurality of outer conductive structures that extend in the first direction, and wherein there are no inner conductive structures disposed in a line extending in the second direction between the first and second trenches and a second subset of the plurality of outer conductive structures that extend in the second direction.

10. The semiconductor device of claim 1, further comprising a second dielectric layer disposed over the second conductive layer, and a third conductive layer disposed over the second dielectric layer, and wherein the first and third conductive layers are connected to each other.

11. The semiconductor device of claim 1, wherein the semiconductor substrate includes a silicon interposer disposed below one or more semiconductor dies.

12. A semiconductor package, comprising:
a plurality of semiconductor dies disposed laterally with respect to one another;
a silicon interposer disposed below plurality of semiconductor dies and electrically connected to the plurality of semiconductor dies, the silicon interposer comprising:
a semiconductor substrate having a plurality of first trenches extending along a first direction and a plurality of second trenches extending along a second direction that is perpendicular to the first direction;
a first conductive layer disposed over the first and second trenches of the semiconductor substrate;
a first dielectric layer disposed over the first conductive layer;
a second conductive layer disposed over the first dielectric layer;
a plurality of inner conductive structures disposed adjacent to the first and second trenches, wherein a first subset of the plurality of inner conductive structures is disposed between the first and second trenches; and
a plurality of outer conductive structures disposed adjacent to the plurality of inner conductive structures and farther to the first and second trenches than the plurality of inner conductive structures; and
a package substrate disposed below and electrically connected to the silicon interposer.

13. The semiconductor package of claim 12, wherein the plurality of inner conductive structures include a first subset of inner conductive structures that surround the plurality of first trenches and a second subset of inner conductive structures that surround the plurality of second trenches, and wherein a subset of the plurality of outer conductive structures are disposed between the first and second subsets of inner conductive structures.

14. The semiconductor package of claim 12, wherein the subset of inner conductive structures are arranged in a line and disposed between the first and second trenches.

15. The semiconductor package of claim 12, wherein a second subset of the plurality of inner conductive structures is disposed in a line extending in the first direction and located between the first and second trenches and a first subset of the plurality of outer conductive structures that extend in the first direction, and wherein there are no inner conductive structures disposed in a line extending in the second direction between the first and second trenches and a second subset of the plurality of outer conductive structures that extend in the second direction.

16. The semiconductor device of claim 12, further comprising a second dielectric layer disposed over the second conductive layer, and a third conductive layer disposed over the second dielectric layer, and wherein the first and third conductive layers are connected to each other.

* * * * *